(12) United States Patent
Goettfert et al.

(10) Patent No.: US 10,879,934 B2
(45) Date of Patent: Dec. 29, 2020

(54) INTEGRATED CIRCUIT AND METHOD FOR PROCESSING AN ENCODED MESSAGE WORD

(71) Applicant: INFINEON TECHNOLOGIES AG, Neubiberg (DE)

(72) Inventors: Rainer Goettfert, Putzbrunn (DE); Bernd Meyer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 31 days.

(21) Appl. No.: 16/274,269

(22) Filed: Feb. 13, 2019

(65) Prior Publication Data
US 2019/0253078 A1 Aug. 15, 2019

(30) Foreign Application Priority Data
Feb. 15, 2018 (DE) .................. 10 2018 103 408

(51) Int. Cl.
*H03M 13/00* (2006.01)
*H03M 13/15* (2006.01)

(52) U.S. Cl.
CPC ......... *H03M 13/152* (2013.01); *H03M 13/15* (2013.01); *H03M 13/1545* (2013.01); *H03M 13/1575* (2013.01); *H03M 13/6502* (2013.01)

(58) Field of Classification Search
None
See application file for complete search history.

(56) References Cited

U.S. PATENT DOCUMENTS

| | | | | |
|---|---|---|---|---|
| 4,597,083 A | * | 6/1986 | Stenerson | H03M 13/15 714/753 |
| 5,384,786 A | * | 1/1995 | Dudley | G06F 11/1008 714/784 |
| 2003/0159103 A1 | * | 8/2003 | Mizrachi | H03M 13/15 714/782 |

(Continued)

OTHER PUBLICATIONS

G. Şerban, C. Anton, I. Tutănescu, L. Ionescu and A. Mazăre, "An implementation of BCH codes in a FPGA," 2010 International Conference on Applied Electronics, Pilsen, 2010, pp. 1-4. (Year: 2010).*

(Continued)

*Primary Examiner* — Daniel F. McMahon
(74) *Attorney, Agent, or Firm* — Viering, Jentschura & Partner mbB (57) ABSTRACT

An integrated circuit includes a receiver configured to receive a message word and an integrated hardware decoding circuit. The decoding circuit includes a calculation unit to calculate a syndrome of the message word according to a predetermined BCH code, a logarithmization unit to establish a logarithm of each of one or more syndrome components, an arithmetic circuit to establish a logarithm of each of one or more zeros of the error locator polynomial of the BCH code on the basis of the logarithms of the syndrome components, and a bit inverter circuit to invert the one or more bits of the message word, the positions of which are specified by the logarithms of the zeros of the error locator polynomial. The integrated circuit further includes a data processing circuit to process further the message word processed by the bit inverter circuit.

21 Claims, 4 Drawing Sheets

(56) References Cited

U.S. PATENT DOCUMENTS

| | | | | |
|---|---|---|---|---|
| 2003/0192007 A1* | 10/2003 | Miller | ................ | H03M 13/158 |
| | | | | 714/782 |
| 2006/0195769 A1* | 8/2006 | Hassner | ............ | G11B 20/1833 |
| | | | | 714/785 |
| 2010/0332942 A1* | 12/2010 | Wezelenburg | ...... | G06F 11/1048 |
| | | | | 714/763 |
| 2014/0181614 A1 | 6/2014 | Kwok | | |

OTHER PUBLICATIONS

Office Action issued in counter German Patent Application No. DE10 2018 103 408.3 dated Sep. 25, 2018, 5 pages (for reference purpose only).

\* cited by examiner

INTEGRATED CIRCUIT AND METHOD FOR PROCESSING AN ENCODED MESSAGE WORD

CROSS-REFERENCE TO RELATED APPLICATION

This application claims priority to German Patent Application Serial No. 10 2018 103 408.3, which was filed Feb. 15, 2018, and is incorporated herein by reference in its entirety.

TECHNICAL FIELD

Various embodiments relate generally to integrated circuits and methods for processing an encoded message word.

BACKGROUND

Electronic circuits that are used for security-relevant applications, such as chip card modules and control processors in automobiles, for example, must be protected against attacks. In particular, it is typically desirable for it to be identifiable whether data that was stored in a memory, for example in a non-volatile memory, was manipulated (or has errors for another reason) and possibly may be corrected. Hardware implementations of such functionality that require little chip area are desirable.

SUMMARY

An integrated circuit includes a receiver configured to receive a message word and an integrated hardware decoding circuit. The decoding circuit includes a calculation unit to calculate a syndrome of the message word according to a predetermined BCH code, a logarithmization unit to establish a logarithm of each of one or more syndrome components, an arithmetic circuit to establish a logarithm of each of one or more zeros of the error locator polynomial of the BCH code on the basis of the logarithms of the syndrome components, and a bit inverter circuit to invert the one or more bits of the message word, the positions of which are specified by the logarithms of the zeros of the error locator polynomial. The integrated circuit further includes a data processing circuit to process further the message word processed by the bit inverter circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The following detailed description relates to the attached figures, which show details and embodiments. These embodiments are described in such great detail that a person skilled in the art can carry out the invention. Other embodiments are also possible and the embodiments can be modified from a structural, logical and electrical point of view without deviating from the subject matter of the invention. The various embodiments do not necessarily preclude one another; instead, various embodiments can be combined with one another such that new embodiments arise. Within the scope of this description, the terms "connected", "attached" and "coupled" are used to describe both a direct and indirect connection, a direct or indirect attachment, and direct or indirect coupling.

Figure 1:
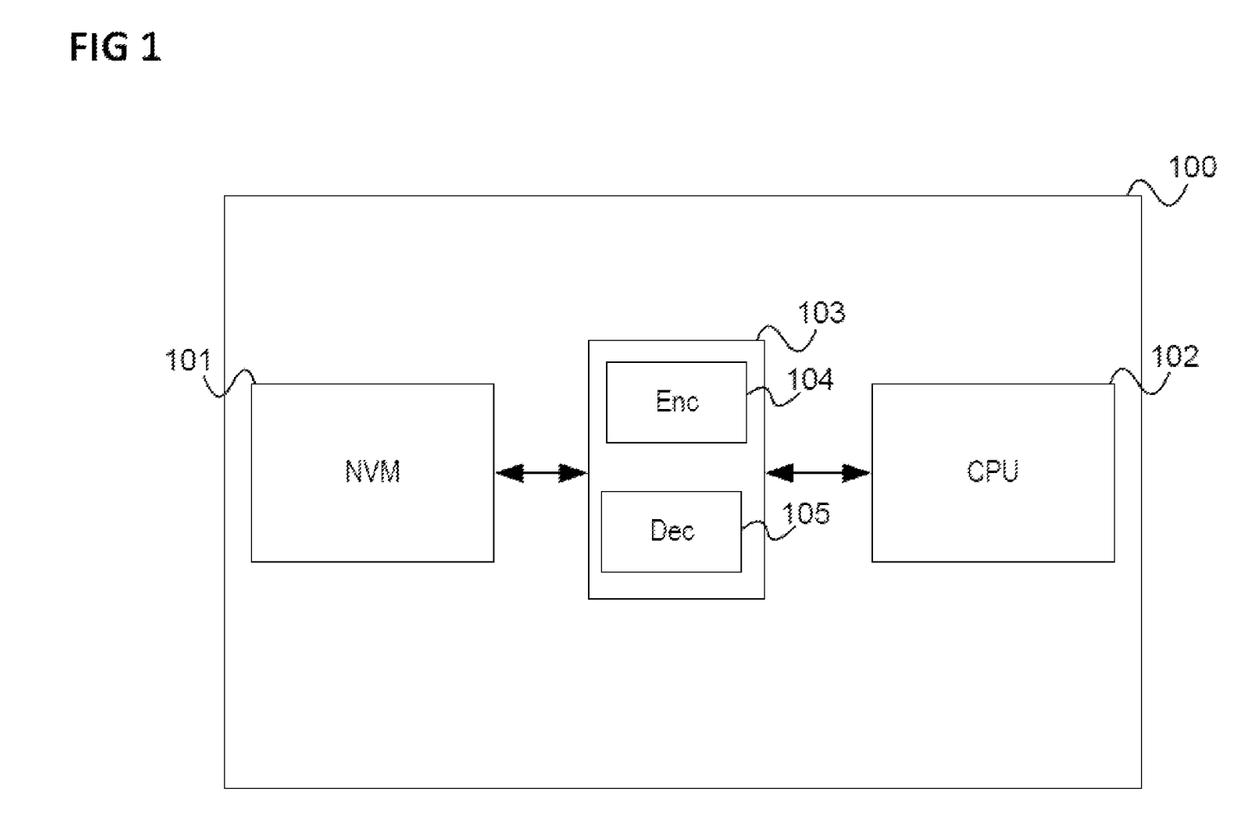
FIG. 1 shows an integrated security circuit with a non-volatile memory.

FIG. 1 shows an integrated security circuit (security IC) 100 with a non-volatile memory 101.

The security IC 100 includes a microprocessor 102, which can access the non-volatile memory 101 and process data stored therein. To this end, a mechanism is provided, said mechanism identifying, and correcting, bit errors in the stored data. According to various embodiments, a hardware circuit 103 is provided, said hardware circuit realizing an error detection and error correction mechanism in hardware. The circuit 103 realizes an encoder 104, which encodes data (in the form of data words, e.g., (bus) messages) to be stored in the memory 101, i.e., establishes an associated codeword according to a predetermined code for a data word to be stored, said codeword then being stored in the memory 101. For the readout, the memory realizes a decoder 105, which, for a stored word, establishes whether this is a valid codeword according to the predetermined code or whether this is not a valid codeword and hence contains errors. Depending on the number of errors and the number of errors that can be corrected by the code, the decoder 105 corrects the stored word to form a valid codeword. The decoder 105 supplies the valid codeword to the microprocessor 102.

The security IC 100 is part of the control device (e.g., in a vehicle) or part of a chip card (with any form factor), for example.

By way of example EEPROM, flash memory, FeRAM or RRAM (resistant random access memory) can be used for the non-volatile memory 101.

However, the use of non-volatile memories 101 in a security IC 100 places increased demands on the employed mechanism for identifying and correcting bit errors in the stored data. Typically, an error correcting code (ECC) which is able to efficiently identify and correct at least all 1- and 2-bit errors is required for secure operation of the memory 101. (This means that the minimum distance of the employed code must be at least 5.) Here, encoding of data to be stored (e.g., in the form of messages) and decoding and correcting errors of read data (e.g., in the form of messages) should be implemented automatically by the hardware circuit 103 of the security IC 100. Therefore, a suitable implementation should typically have the following properties:

The employed code should have as few redundancy bits as possible in order to minimize the additional space costs for storing the redundancy information items in the non-volatile memory 101.

Errors should be identified and corrected quickly. Error-free memory contents should not delay the read process and error patterns that occur relatively frequently (e.g., 1-bit errors) should be able to be corrected more quickly than rarer error patterns.

The circuit 103 that realizes the encoder and decoder should be minimized in respect of space requirements.

The coding and decoding processes should have low power and energy requirements.

According to various embodiments, an implementation of a Bose-Chaudhuri-Hocquenghem code (BCH code) over the finite field GF(2) under given boundary conditions is provided. According to one embodiment, this, i.e., encoding and error correction according to the code, is realized by a hardware circuit 103.

In general, decoding a linear code starts with the application of the check matrix of the code to a received message word that possibly contains errors (said message word, for example, being able to be a word that is read from a memory 101 and transmitted via a bus, for example). The result of the application of the check matrix to the message word is the syndrome of the message word. In the case of a BCH code, the syndrome, in the general case, represents a tuple of elements of a finite extension field. An error-free message word is a codeword (i.e., a valid word of the code) and has a syndrome of 0 (i.e., the elements of the extension field that make up the syndrome all equal zero). Conversely, each error case to be identified and/or to be corrected uniquely corresponds to a syndrome value that differs from 0. If the assignment between occurred error case and associated syndrome value is known, the errors in the received message word can be corrected.

A simple strategy for implementing a decoder consists of, for example, tabulating the error cases to be corrected and their associated syndromes. Such a table decoder can then determine the error pattern for a syndrome value of the check matrix by way of table lookup and can correct the received word. Since the minimum number of syndromes to be distinguished for a code of length n and for correcting up to s errors grows with $O(n^s)$, such a table has a size of $O(n^s \log(n))$ and the described procedure can quickly become impractical in the case of relatively long codeword lengths and/or treating a plurality of bit errors.

The size of the necessary table can be reduced, for example using a Meggitt decoder, the latter however requiring a character-by-character work through of the word to be decoded. In various embodiments, it is not possible to efficiently process the word in parallel or in relatively large blocks therewith.

Conversely, it is possible to test all possible error cases in $O(n^s)$ calculation steps. Then, it is no longer necessary to store syndromes of error cases in a table. However, the decoding algorithm becomes very slow as a result of this "on-the-fly" calculation of all possible error syndromes.

Multifaceted trade-offs between calculation time and necessary chip area are possible between these two extreme cases. However, more efficient decoding algorithms normally require complicated implementations of arithmetic operations (addition, multiplication and division) in finite fields or extension fields which is why these algorithms tend to be suitable for software implementations or are based on shift register constructs as a result of which an efficient implementation in hardware is often possible, although a relatively large number of individual calculation steps is often required at the same time for implementing the decoding.

The class of the BCH codes used below reduces the problem of decoding a codeword with s errors to the calculation of the zeros of the so-called error locator polynomial of degree s over an extension field $GF(2^e)$. Here, the coefficients of the polynomial are rational functions of the syndrome components of the received codeword.

Various techniques can be used for determining the zeros of polynomials of $GF(2^e)[x]$. For polynomials up to degree 5, the search of the zeros can be reduced by suitable rational transformations of the polynomial equation to one or more table lookups for quadratic and cubic equations. The values of the tables must subsequently be mapped back to the initial equation by means of the inverse rational transformations. The size of these precalculated tables is $O(e2^e)$, as a result of which the solution approach is typically restricted to fields with a relatively small extension degree e. In general, complicated calculation operations in the extension field $GF(2^e)$ for the rational transformations of the coefficients and the zeros between the various polynomial equations are necessary, which is why corresponding decoders are typically implemented in software.

Two implementation techniques are mainly used for implementing the arithmetic in $GF(2^e)$: the elements of the extension field are represented either as elements of a vector space with coefficients from GF(2) or in respect of the discrete logarithm of a primitive element $\alpha \in GF(2^e)$. Here, the equivalent representations $GF(2^e)=GF(2)[x]/<p(x)>=GF(2)[\alpha]$ of the extension field are used. Here $p \in GF(2)[x]$ is a polynomial of degree deg(p)=e that is irreducible over GF(2). Usually, the polynomial basis $\{1, x, x^2, x^3, \ldots, x^{e-1}\}$ or the normal basis $\{1, x, x^2, x^4, \ldots, x^{2[<]BEGINITALm(e-1)}\}$ are used as bases for the vector space representation.

The addition of field elements from $GF(2^e)$ is easy to implement in the vector space representation (component-by-component XOR operations on the coefficient vectors of GF(2)); in the discrete logarithm representation in respect of a primitive element $\alpha$, the multiplication of field elements from $GF(2^e)$ is easy to implement (addition of the discrete logarithms modulo 2e−1). In the vector space representation, the coefficient vector from GF(2) can be identified by the bit strings in $\{0, 1\}e$ or by the numbers $\{0, \ldots, 2^e-1\}$ in binary representation.

In the logarithm representation, elements (that differ from 0) can be identified by way of their discrete logarithm with the numbers $\{0, \ldots, 2^e-2\}$ and by way of the binary representation of the numbers with bit strings in $\{0, 1\}^e$.

Let $\alpha$ be a primitive element of order $\text{ord}(\alpha)=2^e-1$ of a finite extension field $GF(2^e)$ with $2^e-1 \geq n$ and let e be odd. That is to say, $GF(2^e)=GF(2)[\alpha]$. For an element $z \in GF(2e)^*$ with $z=\alpha^s$, let $s=d \log(z)$ denote the discrete logarithm of z to the base $\alpha$. Without loss of generality, $0 \leq d \log(z) \leq 2e-2$ always applies below. As a result of the assumption that the extension degree e is odd, the following representations simplify at a number of locations. Otherwise, further case analysis has to be considered.

The use of a Zech logarithm table for fields with a small extension degree e is a widespread method for calculating the sum of field elements $\alpha^i$ and $\alpha^j$ in the discrete logarithm representation i and j in respect of a primitive element $\alpha$. For an exponent $0 \leq x \leq 2^e-2$, the Zech logarithm table contains the discrete logarithm $Z(x)=d \log(\alpha^x+1)$. The sum of field elements with representations i and j with $i \neq j$ is then calculated as $d \log(\alpha^i+\alpha^j)=Z(i-j \mod 2^e-1)+j \mod 2^e-1$, as $\alpha^i+\alpha^j=(a^{i-j}+1) \alpha^j$ applies. This method of addition is usually used in software for relatively small extension fields.

Typically, multiplications of field elements in vector space representation are complicated in terms of both hardware and software. In the case of hardware implementations, $O(e^2)$ gates are required to this end. In the software, tables with small reduced multiples of a factor are frequently precalculated in order to accelerate the multiplication. The normal basis representation facilitates fast squaring of field elements. The square of a number then corresponds to a rotation of its coefficient representation in the normal basis representation.

For the purposes of simplifying the representation, encoding and decoding of a conventional, systematically coded (n, k, d) BCH code over GF(2) with codewords from $\{0, 1\}^n$, dimension k and minimum distance d are described below. The decoders described below only require precalculated tables of size O(n log(n)). The described techniques are not restricted to the specific selection of the code and can be varied in multifaceted ways.

The following notation is used below: let $m_1, \ldots, m_6 \in$ GF(2)[x] be minimal polynomials of $\alpha, \alpha^2, \ldots, \alpha^6$ and let $g_1(x)=1$ cm$(m_1, \ldots, m_2)$, $g_2(x)=1$ cm$(m_1, \ldots, m_4)$ and $g_3(x)=1$ cm$(m_1, \ldots, m_6)$ be the generator polynomials $g_1(x)$, $g_2(x)$, $g_3(x) \in$ GF(2)[x] of associated BCH codes. (Here, 1 cm(x, y) denotes the least common multiple of the polynomials x and y in GF(2)[x].) Then, $g_1$ with degree deg$(g_1)$=e produces a $(2^e-1, 2^e-1-e, 3)$ BCH code $C_1$, $g_2$ with degree deg$(g_2)$=2e produces a $(2^e-1, 2^e-1-2e, 5)$ BCH code $C_2$ and $g_3$ with degree deg$(g_3)$=3e produces a $(2^e-1, 2^e-1-3e, 7)$ BCH code $C_3$. The code $C_1$ can correct 1-bit errors, the code $C_2$ can correct 2-bit errors and the code $C_3$ can correct 3-bit errors. The syndromes of the code $C_1$ represent elements of the extension field GF($2^e$), the syndromes of the code $C_2$ represent pairs of elements from GF($2^e$) and the syndromes of the code $C_3$ represent triplets of elements from GF($2^e$).

Fundamental Mode of Operation of the BCH Coding According to One Embodiment:

The systematic encoder 104 interprets a message $u=(u_{d-1}, \ldots, u_0)$ of length d as a polynomial $u(x) = u_{d-1} x^{d-1} + \ldots + u_1 x + u_0 \in$ GF(2)[x] and calculates the remainder $r(x) = u(x) \, x^{deg(g)}$ mod $g(x)$ of the polynomial division from the associated polynomial of the received message $u(x)$ and a generator polynomial $g(x)$ in GF(2)[x]. The coefficients of the polynomial $m(x) = u(x) \, x^{deg(g)} + r(x)$ form the systematically encoded codeword $m = (m_{n-1}, \ldots, m_0)$ that belongs to u. According to construction, $m(x)$ mod $g(x)$=0 applies.

By way of example, a simple implementation of an encoder in hardware can be brought about by way of a linear feedback shift register (LFSR) with feedback function $g(x)$. If the message u is shifted into the LFSR bit-by-bit (starting with the MSB, LFSR in the 0 state), the register at the end contains the sought-after coefficients of $r(x)$ as the state.

Fundamental Mode of Operation of the BCH Decoding According to One Embodiment:

The decoder 105 interprets a received message (e.g., a read memory word) $m=(m_{n-1}, \ldots, m_0)$ as polynomial $m(x)=m_{n-1}x^{n-1} + \ldots + m_1 x + m_0 \in$ GF(2)[x]. The message m consists of the stored codeword w, which was originally calculated by the encoder and which was modified by an error pattern e. In the case of bitwise XOR operation, $m = w \oplus e$ applies to the bit strings (i.e., to the binary representations of w and e) and $m(x)=w(x)+e(x)$ applies to the associated polynomials over GF(2). Since the constructed codes can correct at most 3-bit errors, the assumption is made that $e(x)=e_1 x^{p_1} + e_2 x^{p_2} + e_3 x^{p_3}$ applies, where $e_1, e_2, e_3 \in$ GF(2) and $0 \leq p_1, p_2, p_3 \leq n-1$ denotes the positions of possible bit errors.

In order to decode the received message m, the remainder $r(x)=m(x)$ mod $g(x)$ of the polynomial division of the associated polynomial of the received message $m(x)$ and the generator polynomial $g(x)$ of the employed code in GF(2)[x] is initially determined. If the remainder $r(x)$ is the zero polynomial, no correctable error was detected and decoding the message is completed.

Otherwise, the syndrome of the received message is calculated, said syndrome being represented by a tuple $(s_1, \ldots, s_k)$ of field elements $s_1, \ldots, s_k \in$ GF($2^e$) of the extension field. The following relationship applies: $s_i=r(\alpha^i)=(m(x) \bmod g(x))(\alpha^i)=((w(x)+e(x)) \bmod g(x))(\alpha^i)=e(\alpha^i)$ for $1 \leq i \leq k$, since, according to the construction, $\alpha, \alpha^2, \ldots, \alpha^k$ are the zeros of the employed generator polynomial $g(x)$ and $w(x)$ mod $g(x)$=0 applies. Here, the value k depends on the minimum distance of the code to be achieved.

The calculations of the division remainder $r(x)$ and of the field elements $s_1, \ldots, s_k$ representing the syndrome can be efficiently implemented as matrix multiplications over GF(2). Like in the case of calculating the remainder, the division remainder $r(x)$ can be calculated in the encoder 104. In various embodiments, the same algorithm and hence the hardware of the encoder 104 can (at least partly) be reused for decoding a message.

For the purposes of calculating the syndrome components $s_i=r(\alpha^i)$ for $1 \leq i \leq k$, matrices $N_i \in \{0, 1\}^{e \times deg(g)}$, whose entries in the j-th column consist of the coefficient representation of the field element $\alpha^{ij}$ for $0 \leq j \leq deg(g)-1$, are precalculated, wherein the elements of the extension field are represented with respect to a suitable basis representation (e.g., the polynomial basis) over GF(2). In various embodiments, this means that matrix multiplications can be realized in hardware with $N_i$ as combinatorial circuits only consisting of XOR and AND gates. Hence, the following relationship then applies:

$$s_i = r(\alpha^i) = N_i r \text{ for } 1 \leq i \leq k,$$

where r is the coefficient vector of the polynomial $r(x)$.

In the case of a textbook implementation of a BCH decoder for correcting an s-bit error, the coefficients $\lambda_s, \ldots, \lambda_1 \in$ GF($2^e$) of the error locator polynomial $\lambda(x) = \lambda_s x^s + \lambda_{s-1} x^{s-1} + \ldots + \lambda_1 x + 1 \in$ GF($2^e$)[x] are determined next. The coefficients $\lambda_s, \ldots, \lambda_1$ are elements of the extension field and can be represented as rational functions $\lambda_i = v_i(s_0, \ldots, s_k)$ of the syndrome components $s_j = r(\alpha^j)$ for $1 \leq j \leq k$. The zeros $\mu_1 = \alpha^{-p_1}, \mu_2 = \alpha^{-p_2}, \ldots, \mu_s = \alpha^{-p_s}$ of the error locator polynomial $\lambda(x)$ then yield the positions $p_1, p_2, \ldots, p_s$ of the bit errors to be corrected. The error positions can subsequently be calculated by calculating the discrete logarithms of the zeros as $p_i = -d \log(\mu_i) \bmod 2^e-1$ for $1 \leq i \leq s$.

Multifaceted approaches and algorithms for calculating the coefficients of the error locator polynomial and its zeros are possible. Since the evaluation of the rational functions $v_i$ and the determination of the zeros ti of the error locator polynomial are relatively complicated in the general form and require many computational operations in the extension field GF($2^e$), a different approach for decoding a received message is used according to one embodiment. The decoder 105 according to the embodiments described below initially determines what error case is present and then uses specially precalculated tables for determining the zeros for each error case, said tables minimizing the number of remaining arithmetic operations in the extension field.

Now, appropriate formulae for an efficient table decoder are derived for each considered error case and the mode of operation of the decoder 105 is described. Here, all occurring tables have the size O(n log(n)), where n is the length of the codewords.

The algorithms realized in hardware by the decoder 105 are specified below as pseudocode.

1-Bit Error Case:

In the 1-bit error case, $s_1 = r(\alpha) = e(\alpha) = \alpha^{p_1}$ applies to the syndrome. Therefore, only the discrete logarithm $p_1 = d \log(s_1)$ has to be formed for the purposes of determining the error position. The following algorithm can be used for decoding a 1-bit error:

```
1. r(x) ← m(x) mod g(x)
2. if r(x) = 0 then stop         /* no correctable error */
3. S₁ ← r(α)                     /* by matrix multiplication by N₁ */
4. a ← DLOG[s₁]                  /* by table lookup */
5. flip bit a in m
```

The function D LOG[x] is precalculated and tabulated for the values $0 \leq x \leq 2^e.-.2$. To this end, integers x and elements $\alpha^y$ of the extension field, which are represented as bit vectors over the main field GF(2) in respect of a vector space representation, are identified in a suitable fashion. The size of this table is only $O(n \log(n))$, where n is the length of the codewords. Since $n \leq \text{ord}(\alpha) = 2^e.-.1$ applies, $s_1$ cannot equal 0 in the 1-bit error case.

2-Bit Error Case:

In the 2-bit error case, the error locator polynomial has the general form $\lambda(x) = \lambda_2 x^2 + \lambda_1 x + 1 \in GF(2^e)[x]$. The zeros $\mu_1 = \alpha^{-p_1}$ and $2 = \alpha^{-p_2}$ determine the positions $p_1$ and $p_2$ of the bit errors to be corrected.

By way of example, the following linear system of equations is obtained using the Peterson-Gorenstein-Zierler method as an ansatz for determining the coefficients of the error locator polynomial:

$$s_1 \lambda_2 + s_2 \lambda_1 + s_3 = s_3$$

$$s_2 \lambda_2 + s_3 \lambda_1 + s_4 = s_4$$

The solutions of the system of equations emerge as $(s_1 s_3 + s_2^2) \lambda_1 = s_1 s_4 + s_2 s_3$ and $(s_1 s_3 + s_2^2) \lambda_2 = s_3^2 + s_2 s_4$. The leading product term $s_1 s_3 + s_2^2 = \alpha^{p_1+p_2}(\alpha^{p_1} + \alpha^{p_2})^2$ corresponds to the determinant of the left-hand side of the system of equations and it is 0 if the received code word contains a 1-bit error. It is evident from what is stated below that this case need not be tested separately during the execution of the algorithm.

By way of inserting, $\lambda(x) = 0$ yields the quadratic equation $$(s_3^2 + s_2 s_4)x^2 + (s_1 s_4 + s_2 s_3)x + s_1 s_3 + s_2^2 = 0 \quad (1)$$

over $GF(2^e)$. Because an extension field is based on the characteristic 2, $s_2 = s_1^2$, $s_4 = s_1^4$ apply and equation (1) can be further simplified for the case of a 2-bit error as $$(s_3 + s_1^3)x^2 + s_1^2 x + s_1 = 0. \quad (2)$$

The zeros of equation (2) can now be explicitly calculated using the half trace function. After the division by the leading coefficient $s_3 + s_1^3 = \alpha^{p_1+p_2}(\alpha^{p_1} + \alpha^{p_2})$ (the latter is not 0 since the 2-bit error case is considered here) and the substitution $x = s_1^2 y/(s_3 + s_1^3)$, the following equation emerges:

$$y^2 + y = 1 + s_3/s_1^3 \quad (3)$$

The efficiency of the decoding algorithm described below arises from the fact that equation (3) only still depends on a single value $s_3/s_1^3$ that is calculated from syndrome components.

For an extension field $GF(2^e)$ with an odd extension degree e, the half trace function is defined by $HT(x) = x + x^4 + x^{16} + \ldots + x^{4[<]BEGINITALm((e-1)/2)}$. Using this notation, the zeros of equation (3) emerge as $y_1 = HT(1 + s_3/s_1^3)$ and $y_2 = HT(1 + s_3/s_1^3) + 1$ if $Tr(1 + s_3/s_1^3) = 0$ applies to the trace. Otherwise, the quadratic equation (3) has no solutions in $GF(2^e)$.

Hence, the zeros of equation (2) are calculated as $$\mu_1 = HT(1 + s_3/s_1^3)/(s_1(1 + s_3/s_1^3)) \quad (4)$$

and $$\mu_2 = (HT(1 + s_3/s_1^3) + 1)/(s_1(1 + s_3/s_1^3)). \quad (5)$$

This means that the zeros $\mu_1$ and $\mu_2$ can therefore be represented as functions of $s_1$ and $1 + s_3/s_1^3$.

By taking the logarithm of equations (4) and (5) by means of the discrete logarithm to base α in $GF(2^e)$ and using the notations $a = d \log(s_1)$ and $b = d \log(s_3)$, the following equations emerge:

$$-p_1 = d \log(\mu_1) = -a - Z(b - 3a) + d \log(HT(\alpha^{Z(b-3a)})) \mod 2^e.-.1$$

and $$-p_2 = d \log(\mu_2) = -a - Z(b - 3a) + Z(d \log(HT(\alpha^{Z(b-3a)}))) \mod 2^e.-.1,$$

where Z( ) denotes the already defined Zech logarithm function.

The following algorithm can be used to decode a 2-bit error:

```
1. r(x) ← m(x) mod g(x)
2. if r(x) = 0 then stop;        /* no correctable error */
3. s₁ ← r(α)                     /* by matrix multiplication by N₁ */
4. a ← DLOG[s₁]                  /* by table lookup */
5. s₃ ← r(α³)                    /* by matrix multiplication by N₃ */
6. b ← DLOG[s₃]                  /* by table lookup */
7. c ← b – 3a mod 2ᵉ – 1
8. if c = 0 then correct 1-bit error;
9. q₁ ← Q1[c]                    /* by table lookup */
10. q₂ ← Q2[c]                   /* by table lookup */
11. q₁ ← a - q₁ mod 2ᵉ – 1
12. q₂ ← a - q₂ mod 2ᵉ – 1
13. flip bit q₁ in m
14. flip bit q₂ in m
```

For the decoder algorithm realized by the decoder, the functions D LOG[x], Q1 $[x] = -Z(x) + d \log(HT(\alpha^{Z(x)})) \mod 2^e.-. 1$ and Q2$[x] = -Z(x) + Z(d \log(HT(\alpha^{Z(x)}))) \mod 2^e.-.1$ are precalculated and tabulated for values $0 \leq x \leq 2^e.-.2$. To this end, integers x and elements $\alpha^y$ of the extension field, which are represented in respect of a vector space representation as bit vectors over the main field GF(2), are identified in a suitable fashion. The size of these tables is only $O(n \log(n))$, where n is the length of the codewords. Since $n \leq \text{ord}(\alpha) = 2^e - 1$ applies, $s_1$ cannot be 0, even in the 2-bit error case. The syndrome component $s_3$ cannot be 0 in the 2-bit error case since $s_3 = \alpha^{3p_1+3p_2} = s_1 (\alpha^{2p_1} + \alpha^{p_1+p_2} + \alpha^{2p_2}) = s_1 \alpha^{2p_2}(\alpha^{2p_1 - 2p_2} + \alpha^{p_1 - p_2} + 1)$ applies. Because the two first factors on the right-hand side differ from 0 in the 2-bit error case and the quadratic term has no zeros $(Tr(1) \neq 0)$ in the case of an odd extension degree, the claim follows.

If the values Q1 [x] and Q2[x] are stored as a pair in a single table in each case, steps 9 and 10 of the algorithm above can be parallelized. Likewise, steps 13 and 14 can be parallelized.

The aforementioned algorithm has the following properties:

Only matrix multiplication over GF(2), table lookup and subtraction modulo $2^e - 1$ operations are required, where e is the extension degree of the finite field. All employed operations can be efficiently realized in hardware and can also be executed in parallel at many points. Hence, a faulty message can quickly be decoded.

As a result of taking the logarithms of the solution equations for the quadratic error locator polynomial, there is no need for arithmetic in the extension field in vector space representation. In various embodiments, it is possible to dispense with corresponding divisions in $GF(2^e)$.

The size of the employed tables only grows with $O(n \log(n))$. As a result, the area requirements of the decoder 105 are reduced.

The Chien search for determining the zeros of the error locator polynomial is dispensed with. The Chien search tests all elements of the extension field as to whether they are zeros using the Horner scheme, and hence it is only efficient for very small extension degrees.

3-Bit Error Case:

In the 3-bit error case, the error locator polynomial has the general form $\lambda(x) = \lambda_3 x^3 + \lambda_2 x^2 + \lambda_1 x + 1 \in GF(2^e)[x]$. The zeros $\mu_1 = \alpha^{-p_1}$, $\mu_2 = \alpha^{-p_2}$ and $\mu_3 = \alpha^{-p_3}$ determine the positions $p_1$, $p_2$ and $p_3$ of the bit errors to be corrected.

By way of example, the following linear system of equations is obtained using the Peterson-Gorenstein-Zierler method as an ansatz for determining the coefficients of the error locator polynomial:

$$s_1 \lambda_3 + s_2 \lambda_2 + s_3 \lambda_1 = s_4$$

$$s_2 \lambda_3 + s_3 \lambda_2 + s_4 \lambda_1 = s_5$$

$$s_3 \lambda_3 + s_4 \lambda_2 + s_5 \lambda_1 = s_6$$

Because an extension field is based on the characteristic 2, $s_2 = s_1^2$, $s_4 = s_1^4$ and $s_6 = s_3^2$ apply. The solutions to the system of equations emerge as $\lambda_1 = s_1$, $(s_1^3 + s_3) \lambda_2 = s_1^2 s_3 + s_5$ and $(s_1^3 + s_3) \lambda_3 = (s_1^6 + s_1^3 s_3 + s_5 s_1 + s_3^2)$. Since $s_1^3 + s_3 = (\alpha^{p_1} + \alpha^{p_2})(\alpha^{p_1} + \alpha^{p_3})(\alpha^{p_2} + \alpha^{p_3})$ applies, the factor $s_1^3 + s_3$ differs from 0 in the 3-bit error case and the error locator polynomial emerges as $$\lambda(x) = (s_1^6 + s_1^3 s_3 + s_5 s_1 + s_3^2)/(s_1^3 + s_3) x^3 + (s_1^2 s_3 + s_5)/((s_1^3 + s_3)) x^2 + s_1 x + 1.$$

Now, the "mirrored" error locator polynomial $\eta(x) = x^3 \lambda(1/x) = x^3 + \lambda_1 x^2 + \lambda_2 x + \lambda_3$, which has the zeros $\varphi_1 = \alpha^{p_1}$, $\varphi_2 = \alpha^{p_2}$ and $\varphi_3 = \alpha^{p_3}$, is considered. Using the polynomial $\eta(x)$, substantially simpler rational transformations for the coefficients emerge in the following derivations than in the case of the conventional procedure when the zeros of $\eta(x) = 0$ are determined.

By way of the substitution $x = y + s_1$, the following equation emerges from $\eta(x) = 0$:

$$y^3 + (s_1^5 + s_5)/(s_1^3 + s_3) y + s_1^3 + s_3 = 0.$$

By way of the substitution $y = \text{sqrt}((s_1^5 + s_5)/(s_1^3 + s_3)) z$ (where sqrt(.) denotes the square root function), the following equation emerges:

$$z^3 + z = \text{sqrt}((s_1^3 + s_3)^5/(s_1^5 + s_5)^3). \quad (6)$$

Here, sqrt(x) denotes the unique square root of $x \in GF(2^e)$.

In the case of an odd extension degree e, the term $s_1^5 + s_5$ in the denominator in equation (6) cannot equal 0 in the 3-bit error case. To show this, the equation $s_1^5 + s_5 = (s_1^3 + s_3)(\alpha^{2p_1} + \alpha^{2p_2} + \alpha^{2p_3} + \alpha^{p_1 + p_2} + \alpha^{p_1 + p_3} + \alpha^{p_2 + p_3})$ is used. Using the substitutions $\alpha^{p_2} = (\beta + 1)\alpha^{p_1}$ and $\alpha^{p_3} = (\gamma + 1)\alpha^{p_1}$, $s_1^5 + s_5 = \alpha^{2p_1}(s_1^3 + s_3)(\beta^2 + \gamma^2 + \beta\gamma)$ emerges. From the further substitution $\gamma = \delta\beta$, $s_1^5 + s_5 = \alpha^{2p_1} \beta^2 (s_1^3 + s_3)(\delta^2 + \delta + 1)$ follows. Because the quadratic factor in $\delta$ in the case of an odd extension degree e has no zero ($\text{Tr}(1) \neq 0$) and because the remaining factors in the 3-bit error case differ from 0, the claim follows.

The efficiency of the decoding algorithm described further below emerges from the fact that equation (6) only still depends on a single value $(s_1^3 + s_3)^5/(s_1^5 + s_5)^3$ that is calculated from syndrome components.

Now, in contrast to the error cases considered previously, it is by all means possible for the syndrome components $s_1$, $s_3$ or $s_5$ to be able to assume the value 0 in a 3-bit error case. Therefore, the following cases are distinguished:

1. If $s_1 \neq 0$, $s_3 \neq 0$ and $s_5 \neq 0$:
Let $\xi_1$, $\xi_2$ and $\xi_3$ be the zeros of the equation $z^3 + z = \text{sqrt}((1 + s_3/s_1^3)^5/(1 + s_5/s_1^5)^3)$, which was derived from (6). Then, $\varphi_i = (\text{sqrt}((1 + s_5/s_1^5)/(1 + s_3/s_1^3)) \xi_i + 1) s_1$ are the sought-after zeros of the "mirrored" error locator polynomial $\eta(x)$ for $1 \leq i \leq 3$.

This means the zeros $\varphi_1$, $\varphi_2$ and $\varphi_3$ can therefore be represented as functions of $s_1$, $1 + s_3/s_1^3$ and $1 + s_5/s_1^5$.

By taking the logarithm by means of the discrete logarithm to base $\alpha$ in $GF(2^e)$ and using the notations $a = d \log(s_1)$, $b = d \log(s_3)$ and $c = d \log(s_5)$, the equations $p_i = d \log(\varphi_i) = (Z(W_i(5 Z(b - 3a) - 3 Z(c - 5a)) + Z(c - 5a) - Z(b - 3a)))/2 + a \mod 2^e - 1$ emerge for the error positions $p_i$ with $1 \leq i \leq 3$. Here, the functions $W_i(x)$ denote the logarithms of the zeros of the equation $z^3 + z = \alpha^x$ for $1 \leq i \leq 3$ and $Z(\ )$ is the already defined Zech logarithm function. Moreover, the fact that the function sqrt( ) is linear in $GF(2^e)$ was exploited.

2. If $s_1 = 0$, $s_3 \neq 0$ and $s_5 \neq 0$:
Let $\xi_1$, $\xi_2$ and $\xi_3$ be the zeros of the equation $z^3 + z = \text{sqrt}(s_3^5/s_5^3)$, which was derived from (6). Then, $\varphi_i = \text{sqrt}(s_5/s_3) \xi_i$ are the sought-after zeros of the "mirrored" error locator polynomial $\eta(x)$ for $1 \leq i \leq 3$. This means the zeros $\varphi_1$, $\varphi_2$ and $\varphi_3$ can therefore be represented as functions of $s_3$ and $s_5$. By taking the logarithm by means of the discrete logarithm to base $\alpha$ in $GF(2^e)$ and using the notations $b = d \log(s_3)$ and $c = d \log(s_5)$, the equations $p_i = d \log(\varphi_i) = (W_i(5b - 3c) + c - b)/2 \mod 2^e - 1$ emerge for the error positions $p_i$ with $1 \leq i \leq 3$. Here, the functions $W_i(x)$ denote the logarithms of the zeros of the equation $z^3 + z = \alpha^x$ for $1 \leq i \leq 3$ and $Z(\ )$ is the already defined Zech logarithm function. Moreover, the fact that the function sqrt( ) is linear in $GF(2^e)$ was exploited.

3. If $s_1 \neq 0$, $s_3 = 0$ and $s_5 \neq 0$:
Let $\xi_1$, $\xi_2$ and $\xi_3$ be the zeros of the equation $z^3 + z = \text{sqrt}((1/(1 + s_5/s_1^5)^3))$, which was derived from (6). Then, $\varphi_i = (\text{sqrt}(1 + s_5/s_1^5) \xi_i + 1) s_1$ are the sought-after zeros of the "mirrored" error locator polynomial $\eta(x)$ for $1 \leq i \leq 3$. This means the zeros $\varphi_1$, $\varphi_2$ and $\varphi_3$ can therefore be represented as functions of $s_1$ and $1 + s_5/s_1^5$. By taking the logarithm by means of the discrete logarithm to base $\alpha$ in $GF(2^e)$ and using the notations $a = d \log(s_1)$ and $c = d \log(s_5)$, the equations $p_i = d \log(\varphi_i) = (Z(W_i(-3 Z(c - 5a)) + Z(c - 5a)))/2 + a \mod 2^e - 1$ emerge for the error positions $p_i$ with $1 \leq i \leq 3$. Here, the functions $W_i(x)$ denote the logarithms of the zeros of the equation $z^3 + z = \alpha^x$ for $1 \leq i \leq 3$ and $Z(\ )$ is the already defined Zech logarithm function. Moreover, the fact that the function sqrt( ) is linear in $GF(2^e)$ was exploited.

4. If $s_1 \neq 0$, $s_3 \neq 0$ and $s_5 = 0$:
This case is treated analogously to case 3.

5. If $s_1 \neq 0$, $s_3 = 0$ and $s_5 = 0$:
Let $\xi_1$, $\xi_2$ and $\xi_3$ be the zeros of the equation $z^3 + z = 1$, which was derived from (6). Then, $\varphi_i = (\xi_i + 1) s_1$ are the sought-after zeros of the "mirrored" error locator polynomial $\eta(x)$ for $1 \leq i \leq 3$. This means the zeros $\varphi_1$, $\varphi_2$ and $\varphi_3$ can therefore be represented as functions of $s_1$.

By taking the logarithm by means of the discrete logarithm to base $\alpha$ in $GF(2^e)$ and using the notation $a = d \log(s_1)$, the equations $p_i = d \log(\varphi_i) = Z(W_i(0)) + a \mod 2^e.-.1$ emerge for the error positions $p_i$ with $1 \le i \le 3$. Here, the functions $W_i(x)$ denote the logarithms of the zeros of the equation $z^3 + z = \alpha^x$ for $1 \le i \le 3$ and $Z(\ )$ is the already defined Zech logarithm function.

The 3-bit error case is present if $s_1 = 0$ or $s_1^6 + s_1^3 \ s_3 + s_5 \ s_1 + s_3^2 \ne 0$ applies. As already explained above, $s_1$ cannot be 0 in the 1-bit error case and in the 2-bit error case since $n \le ord(\alpha) = 2^e.-.1$ applies (where n is the length of the codewords). On the other hand, $s_1^6 + s_1^3 \ s_3 + s_5 \ s_1 + s_3^2 = \alpha^{p1+p2+p3}(\alpha^{p1} + \alpha^{p2})(\alpha^{p1} + \alpha^{p3})(\alpha^{p2} + \alpha^{p3})$ applies and therefore cannot be 0 in the 3-bit error case. Rewriting $s_1^6 + s_1^3 \ s_3 + s_5 \ s_1 + s_3^2 = s_1^6((1 + s_3/s_1^3)^2 + (1 + s_3/s_1^3) + (1 + s_5/s_1^5))$ and taking the logarithm by means of the discrete logarithm to base $\alpha$ in $GF(2^e)$ and using the notations $a = d \log(s_1)$, $b = d \log(s_3)$, $c = d \log(s_5)$, $d = Z[b - 3a \mod 2^e - 1]$ and $e = Z[c - 5a \mod 2^e - 1]$, the expression $s_1 \ne 0$ && $Z[d] + d = e$ emerges as test condition for the 1-bit error case or 2-bit error case. Here, $Z(\ )$ is the already defined Zech logarithm function.

The following algorithm can be used to decode a 3-bit error:

```
1. r(x) ← m(x) mod g(x)
2. if r(x) = 0 then stop;           /* no correctable error */
3. s₁ ← r(α)                        /* by matrix multiplication by N₁ */
4. a ← DLOG[s₁]                     /* by table lookup */
5. s₃ ← r(α³)                       /* by matrix multiplication by N₃ */
6. b ← DLOG[s₃]                     /* by table lookup */
7. s₅ ← r(α⁵)                       /* by matrix multiplication by N₅ */
8. c ← DLOG[s₅]                     /* by table lookup */
9. if s₁ = 0 then d ← b else (if s₃ = 0 then d ←0
     else d ← Z[b - 3a mod 2ᵉ - 1]);
10. if s₁ = 0 then e ← c else (if s₅ = 0 then e ← 0
     else e ← Z[c - 5a mod 2ᵉ - 1]);
11. if s₁ ≠ 0 && Z[d] + d mod 2ᵉ - 1 = e then correct 1-bit error or
     2-bit error;
12. f ← 5d - 3e mod 2ᵉ - 1
13. q₁ ← W1[f]                      /* by table lookup */
14. q₂ ← W2F[f]                     /* by table lookup */
15. q₃ ← W3[f]                      /* by table lookup */
16. if s₁ = 0 then q₁ (q₁ + e - d)/2 mod 2ᵉ - 1
     else q₁ ← (Z[q₁ + e - d mod 2ᵉ - 1])/2 + a mod 2ᵉ - 1;
17. if s₁ = 0 then q₂ ← (q₂ +e -d)/2 mod 2ᵉ - 1
     else q₂ ← (Z[q₂ + e - d mod 2ᵉ - 1])/2 + a mod 2ᵉ - 1;
18. if s₁ = 0 then q₃ ← (q₃ + e - d)/2 mod 2ᵉ - 1
     else q₃ ← (Z[q₃ + e - d mod 2ᵉ - 1])/2 + a mod 2ᵉ - 1;
19. flip bit q₁ in m
20. flip bit q₂ in m
21. flip bit q₃ in m
```

For decoding, the functions $D LOG[x]$, $Z[x]$, $W1[x]$, $W2[x]$ and $W3[x]$ are precalculated and tabulated for values $0 \le x \le 2^e.-.2$. To this end, integers x and elements $\alpha^y$ of the extension field, which are represented in respect of a vector space representation as bit vectors over the main field GF(2), are identified in a suitable fashion. The size of these tables is only $O(n \log(n))$, where n is the length of the codewords.

The halving steps modulo $2^e - 1$ in steps 16 to 18 for calculating $x/2 \mod 2^e - 1$ (i.e., calculating square roots from field elements) can be reduced as follows to an addition modulo $2^e - 1$ and a bit-shift operation:

```
1. If LSB(x) =1 then x ← x + 2ᵉ - 1;
2. x ← x>>1                /* MSB(x) =0 always applies after step 1*/
```

If the values $W1[x]$, $W2[x]$ and $W3[x]$ are stored as a triple in a single table in each case, steps 13 to 15 in the decoding algorithm above can be parallelized. Likewise, steps 19 to 21 can be parallelized.

The aforementioned decoding algorithm has the following properties:

Only matrix multiplication over GF(2), table lookup and addition and subtraction modulo $2^e - 1$ operations are required, where e is the extension degree of the finite field. All employed operations can be efficiently realized in hardware and can also be executed in parallel at many points. Hence, a faulty message can quickly be decoded.

As a result of taking the logarithms of the solution equations for the "mirrored" cubic error locator polynomial (also referred to as the "reciprocal" cubic error locator polynomial), there is no need for arithmetic in the extension field in vector space representation. In various embodiments, it is possible to dispense with corresponding divisions in $GF(2^e)$.

The size of the employed tables only grows with $O(n \log(n))$. As a result, the area requirements of the decoder 105 are reduced.

The Chien search for determining the zeros of the error locator polynomial is dispensed with. The Chien search tests all elements of the extension field as to whether they are zeros using the Horner scheme, and hence it is only efficient for very small extension degrees.

Higher Order Error Cases:

Polynomial equations of degree 4 and 5 over $GF(2^e)$ are also solvable in general. Hence, the described procedure for implementing table decoders can also be generalized, in principle, to the 4-bit and 5-bit error case. However, it is no longer possible to reduce the calculation of the zeros of the corresponding error locator polynomials to an individual polynomial equation in a standardized form, which only still depends on a single value calculated from syndrome components. Instead, the calculation of zeros of polynomials of degree 4 and 5 can be reduced to the solution of a plurality of polynomial equations of degree 3 and 2. The zeros of these derived polynomial equations with a reduced degree can then be determined analogously using the techniques already described above. Therefore, overall, a plurality of rational transformations for determining the coefficients of the various polynomial equations, including the back substitutions, have to be calculated for the 4-bit and 5-bit error case. Therefore, the assumption can be made that the algorithmic outlay and the complexity of an implementation in hardware will be significantly greater in comparison with the 1-bit to 3-bit error case.

In the 4-bit error case, the error locator polynomial has the general form $\lambda(x) = \lambda_4 \ x^4 + \lambda_3 \ x^3 + \lambda_2 \ x^2 + \lambda_1 x + 1 \in GF(2^e)[x]$, for example. The zeros $\mu_1 = \alpha^{-p1}$, $\mu_2 = \alpha^{-p2}$, $\mu_3 = \alpha^{-p3}$ and $\mu_4 = \alpha^{-p4}$ determine the positions $p_1$, $p_2$, $p_3$ and $p_4$ of the bit errors to be corrected.

By way of example, the following linear system of equations is obtained using the Peterson-Gorenstein-Zierler method as an ansatz for determining the coefficients of the error locator polynomial:

$$s_1\lambda_4 + s_2\lambda_3 + s_3\lambda_2 + s_4\lambda_1 = s_5$$

$$s_2\lambda_4 + s_3\lambda_3 + s_4\lambda_2 + s_5\lambda_1 = s_6$$

$$s_3\lambda_4 + s_4\lambda_3 + s_5\lambda_2 + s_6\lambda_1 = s_7$$

Because an extension field is based on the characteristic 2, $s_2 = s_1^2$, $s_4 = s_1^4$ and $s_6 = s_3^2$ apply. The solutions to the system of equations emerge as $\lambda_1 = s_1$, $(s_1^6 + s_1^3 \ s_3 + s_1 \ s_5 + s_3^2) \ \lambda_2 = s_1^8 + s_1^5 \ s_3 + s_1 \ s_7 + s_3 \ s_5$, $(s_1^6 + s_1^3 \ s_3 + s_1 \ s_5 + s_3^2) \ \lambda_3 = s_1^6$ $s_3+s_1^4 \ s_5+s_1^2 \ s_7+s_3^3$ and $(s_1^6+s_1^3 \ s_3+s_1 \ s_5+s_3^2) \ \lambda_4=s_1^{10}+s_1^7 \ s_3+s_1^5 \ s_5+s_1^3 \ s_7+s_1^2 \ s_3 \ s_5+s_1 \ s_3^3+s_3 \ s_7+s_5^2$.

Under the assumption that $s_1^6+s_1^3 \ s_3+s_1 \ s_5+s_3^2 \neq 0$ and $s_1 \neq 0$ apply, the "mirrored" error locator polynomial $\eta(x)=x^4+s_1 \ x^3+(s_1^8+s_1^5 \ s_3+s_1 \ s_7+s_3 \ s_5)/(s_1^6+s_1^3 \ s_3+s_1 \ s_5+s_3^2) \ x^2+(s_1^6 \ s_3+s_1^4 \ s_5+s_1^2 \ s_7+s_3^3)/(s_1^6+s_1^3 \ s_3+s_1 \ s_5+s_3^2)x+(s_1^{10}+s_1^7 \ s_3+s_1^5 \ s_5+s_1^3 \ s_7+s_1^2 \ s_3 \ s_5+s_1 \ s_3^3+s_3 \ s_7+s_5^2)/(s_1^6+s_1^3 \ s_3+s_1 \ s_5+s_3^2)$ emerges.

Using the substitutions $x=s_1 \ y$, $s_3=s_1^3 \ (\alpha+1)$, $s_5=s_1^5 \ (\beta+1)$ and $s_7=s_1^7(\gamma+1)$, the following equation emerges for $\eta(x)=0$:

$$y^4+y^3+(\alpha\beta+\beta+\gamma)/(\alpha^2+\alpha+\beta)y^2+(\alpha^3+\alpha^2+\beta+\gamma)/(\alpha^2+\alpha+\beta)y+(\alpha^3+\alpha^2+\alpha\beta+\alpha\gamma+\beta^2)/(\alpha^2+\alpha+\beta)=0 \quad (7)$$

Using the substitution $z=y+\sqrt{((\alpha^3+\alpha^2+\beta+\gamma)/(\alpha^2+\alpha+\beta))}$, the following equation emerges:

$$z^4+z^3+(\alpha\beta+\beta+\gamma)/(\alpha^2+\alpha+\beta)z^2+\sqrt{((\alpha^3+\alpha^2+\beta+\gamma)/(\alpha^2+\alpha+\beta))}z^2+\alpha^2+\alpha+\beta=0 \quad (8)$$

If equation (8) is divided by the constant term, an equation of the form $\pi(z^4+z^3)+\rho z^2+1=0$ emerges. In order to solve this equation, the ansatz $(s \ z^2+v \ z+1)(u \ z^2+v \ z+1)=su \ z^4+v(s+u) \ z^3+(s+u+v^2) \ z^2+1=0$ is used. By comparing coefficients, the following nonlinear system of equations arises:

$$su=\pi, v(s+u)=\pi \text{ and } s+u+v^2=\rho. \quad (9)$$

This system of equations directly yields $v^3+\rho \ v=\pi$, which can be solved using the techniques that were already described for the 3-bit error case. Let $\xi$ be a solution, then $v=\sqrt{(\rho)} \ \xi$ applies. By insertion in (9), the values for s and u emerge from $x^2+\pi/v \ x+\pi=0$ using the techniques described for the 2-bit error case. Now, the equation $(s \ z^2+v \ z+1)(u \ z^2+v \ z+1)=0$ is solvable by virtue of solving the two quadratic equations. By reversing the respective substitutions, the zeros of the "mirrored" error locator polynomial are calculated from the four zeros, the discrete logarithms of the zeros of said "mirrored" error locator polynomial yielding the error positions. Overall, one cubic and three quadratic equations were solved in $GF(2^e)$ in this way.

For the case $s_1=0$, the zeros of the simplified "mirrored" error locator polynomial $\eta(x)=x^4+s_5/s_3 \ x^2+s_3 \ x+(s_3 \ s_7+s_5^2)/s_3^2$ can be determined in analogous fashion. Here, the solution ansatz $(z^2+v \ z+s)(z^2+v \ z+u)=0$ can be utilized.

A significant number of computational operations in $GF(2^e)$ are required for carrying out the various rational coefficient transformations.

In the following embodiment, the systematic encoder 104 operates on data words with a fixed width b (e.g., b=32). In this respect, let $g(x) \in GF(2)[x]$ be the generator polynomial of a BCH code, let $u=(u_{t-1}, \ldots, u_0)$ be a message with $u_i \in \{0, 1\}^b$ for $0 \leq i \leq t-1$, let $M_1 \in \{0, 1\}^{deg(g) \times b}$ be a matrix, the j-th column of which contains the coefficient representation of the polynomial remainder $x^{b+j} \mod g(x)$ for $0 \leq j \leq b-1$, and let $M_2 \in \{0, 1\}^{deg(g) \times b}$ be a matrix, the j-th column of which contains the coefficient representation of the polynomial remainder $x^{deg(g)+j} \mod g(x)$ for $0 \leq j \leq b-1$. In various embodiments, this means that matrix multiplications with $M_1$ and $M_2$ can be realized in hardware as combinatorial circuits only consisting of XOR and AND gates. Hence, the following relationship then applies:

$$r(x)=u(x)x^{deg(g)} \mod g(x)=M_2( \ldots (M_1(M_1(M_1 u_{t-1}+u_{t-2})+u_{t-3})+ \ldots )+u_0).$$

The following algorithm calculates the division remainder r(x):

```
1) r ← 0
2) for i ← t - 1 to 1 {
3)     r ← M₁ (uᵢ + r)
4) }
5) r ← M₂ (u₀ + r)
```

If $t \ (b+1) \leq n$ applies, the algorithm can be simplified to:

```
1) r ← 0
2) for i ← t - 1 to 0 {
3)     r ← M₁ (uᵢ + r)
4) }
```

Consequently, the encoded message has the form $u0^b$. By formally extending the message u by b symbols, it is possible to dispense with the use of the matrix $M_2$. The division remainder r(x) then satisfies the condition $r(x)=u(x) \ x^b \mod g(x)$. As a result, the implementation of the encoder 104 is simplified because it is possible to dispense with the use of the matrix $M_2$ and the case analysis for the data word $u_0$ during the course of the algorithm.

In a further embodiment, the minimal polynomials $m_1, \ldots, m_k \in GF(2)[x]$ that were used to define the generator polynomial $g(x)=1 \ cm(m_1, \ldots, m_k)$ are chosen from the set of all possible minimal polynomials in such a way that the matrix $M_1$ has a minimal weight (i.e., a minimal number of entries that differ from zero), for example. As a result, the chip area required to implement the matrix $M_1$ and the power consumption during the evaluation of the matrix are minimized. By way of example, another or a further optimization criterion can be the minimization of the maximum number of entries that differ from 0 in a row of the matrix, with maximization being carried out over all rows of the matrix. As a result, the time required for calculating the matrix multiplication can be minimized. Corresponding optimization options exist for the matrix $M_2$.

In the case of the implementation of the decoder 105, the precalculated tables are either implemented as ROM (read only memory) tables or synthesized as combinatorial circuits. The choice of mode of implementation can be used to optimize the area requirements and/or the calculation speed.

In one embodiment of the decoder 105, the required chip area for implementing the decoder can be reduced further if the table for calculating the discrete logarithms and the circuit for calculating the modular subtraction are only implemented once. Then, the corresponding work steps have to be carried out in sequence.

In one embodiment, the required chip area for implementing the decoder 105 can be reduced further if the circuits for implementing the required ROM tables (e.g., for the discrete logarithm D LOG[x], for calculating the zeros of the "mirrored" cubic error locator polynomial W1 [x], W2[x] and W3 [x], for the Zech logarithm Z[x] if present) have a common address decoder. Possibly, further work steps previously carried out in parallel then have to be carried out in sequence.

In one embodiment, the decoder 105 tests whether the conditions $r(x) \neq 0$ und $s_1=0$ are satisfied for the 2-bit error case. In this case, the decoder 105 has found a non-correctable multiple error.

In one embodiment of the decoder 105 for the 2-bit error case, there can be a note for an argument x in the tables for calculating the zeros of the quadratic error locator polynomial Q1 [x] and Q2[x] using a specific value, which cannot occur as discrete logarithm of the calculation (e.g., $2^e-1$), said note stating that $Tr(\alpha^{Z(x)})=1$ applies to the trace and the value $0 \leq x \leq 2^e - 2$ consequently cannot occur as a zero of the transformed equation of the error locator polynomial. If a table lookup for $q_1$ or $q_2$ in step 9 or 10 supplies this specific value, the decoder 105 has found a non-correctable multiple error. Here, it is sufficient for the result of a table lookup to be checked. In an analogous fashion, invalid values of the other employed tables can be encoded (e.g., D LOG[0] and Z[0]).

In one embodiment of the decoder 105 for the 2-bit error case, the test for the 1-bit error case and the correction of such an error can be implemented by parallel testing of all associated remainders $r(x)=x^{p1} \mod g(x)$ in hardware. The decoder 105 can then correct 1-bit errors without further delay. The chip area required to this end grows with $O(n \log(n))$.

In one embodiment of the decoder 105 for the 2-bit error case, the test for the 1-bit error case can be implemented by checking the equation $s_3 = s_1^3$ in the extension field $GF(2^d)$. If the equality applies, the 1-bit error case is present. If the field element $s_1^3$ is calculated by a suitable circuit, 1-bit errors can be calculated quicker using this procedure.

In one embodiment of the decoder 105 for the 2-bit error case, the value of $3a \mod 2^e-1$ can be tabulated and read in a table lookup together with the determination of $a=d \log(s_1)$.

In one embodiment of the decoder 105 for the 3-bit error case, it is possible to dispense with the calculation of the roots in $GF(2^e)$ (i.e., the halving modulo $2^e-1$ in steps 16 to 18) by virtue of the root function already being included in the logarithm table D LOG[ ]. Then, the following algorithm can be used to decode a 3-bit error:

```
 1. r(x) ← m(x) mod g(x)
 2. if r(x) = 0 then stop          /* no correctable error */
 3. s₁ ← r(α)                      /* by matrix multiplication by N₁ */
 4. a ← HDLOG[s₁]                  /* by table lookup */
 5. s₃ ← r(α³)                     /* by matrix multiplication by N₃ */
 6. b ← HDLOG[s₃]                  /* by table lookup */
 7. s₅ ← r(α⁵)                     /* by matrix multiplication by N₅ */
 8. c ← HDLOG[s₅]                   /* by table lookup */
 9. if s₁ = 0 then d ← b
      else (if s₃ = 0 then d ← 0 else d ← Z[b − 3a mod 2ᵉ − 1])
10. if s₁ = 0 then e ← c
      else (if s₅ = 0 then e ← 0 else e ← Z[c − 5a mod 2ᵉ − 1])
11. if s₁ ≠ 0 && Z[d] + d mod 2ᵉ − 1 = e then correct 1-bit error
      or 2-bit error;
12. f ← 5d − 3e mod 2ᵉ − 1
13. q₁ ← W1[f]                     /* by table lookup */
14. q₂ ← W2[f]                     /* by table lookup */
15. q₃ ← W3[f]                     /* by table lookup */
16. if s₁ = 0 then q₁ ← q₁ + e − d mod 2ᵉ − 1
      else q₁ ← Z[q₁ +e − d mod 2ᵉ − 1] + 2a mod 2ᵉ − 1;
17. if s₁ = 0 then q₂ ← q₂ + e − d mod 2ᵉ − 1
      else q₂ ← Z[q₂ + e − d mod 2ᵉ − 1] + 2a mod 2ᵉ − 1;
18. if s₁ = 0 then q₃ ← q₃ + e − d mod 2ᵉ − 1
      else q₃ ← Z[q₃ + e − d mod 2ᵉ − 1] + 2a mod 2ᵉ − 1;
19. flip bit q₁ in m
20. flip bit q₂ in m
21. flip bit q₃ in m
```

For decoding, the functions HD LOG[x], Z[x], W1 [x], W2[x] and W3[x] are precalculated and tabulated for values $0 \leq x \leq 2^e.-2$. To this end, integers x and elements $\alpha^y$ of the extension field, which are represented in respect of a vector space representation as bit vectors over the main field GF(2), are identified in a suitable fashion. The size of these tables is only $O(n \log(n))$, where n is the length of the codewords.

Here, the function HD LOG[x] is the discrete logarithm of the root of x, i.e. HD $LOG(x)=d \log(sqrt(x))=d \log(x)/2 \mod 2^e-1$, for the values $0 \leq x \leq 2^e.-2$.

In a further embodiment of the decoder for the 3-bit error case, the test $s_1^6+s_1^3 \; s_3+s_5 \; s_1+s_3^2 \neq 0$ as to whether a 3-bit error case or a 2-bit or 1-bit error case is present (under the condition $s_1 \neq 0$) can be implemented as follows: because $s_1^6+s_1^3 \; s_3+s_5 \; s_1+s_3^2=s_1^6 \; (s_3/s_1^3 \; (1+s_3/s_1^3)+(1+s_5/s_1^5))$ applies, the following is calculated using the notations introduced above:

```
 1. a ← DLOG[s₁]           /* by table lookup */
 2. s₃ ← r(α³)             /* by matrix multiplication by N₃ */
 3. b ← DLOG[s₃]           /* by table lookup */
 4. s₅ ← r(α⁵)             /* by matrix multiplication by N₅ */
 5. c ← DLOG[s₅]           /* by table lookup */
 6. if s₁ = 0 then d ← b else if s₃ = 0 then d ← 0 else {
 7.     b ← b − 3a mod 2ᵉ − 1
 8.     d ← Z[b]
 9. }
10. if s₁ = 0 then e ← c else if s₅ = 0 then e ← 0
      else e ← Z[c − 5a mod 2ᵉ − 1]
11. if s ≠ 0 && b + d mod 2ᵉ − 1 = e then correct 1-bit error or 2-bit
      error
```

In a further embodiment of the decoder for the 3-bit error case, the test $s_1^6+s_1^3 \; s_3+s_5 \; s_1+s_3^2 \neq 0$ as to whether a 3-bit error case or a 2-bit or 1-bit error case is present (under the condition $s_1 \neq 0$) is implemented using a table for a solution of the quadratic equation $x^2+x=c$: Let $V[X]=d \log(y)$ with $y^2+y=\alpha^X$ be the table with the logarithms of a solution of the quadratic equation. (For the case where the quadratic equation has no solution, a specific value is entered, said specific value not being able to occur as discrete logarithm of the calculation (e.g., $2^e-1$).) Then, the following is calculated using the notations introduced above:

```
 1. a ← DLOG[s₁]           /* by table lookup */
 2. s₃ ← r(α³)             /* by matrix multiplication by N₃ */
 3. b ← DLOG[s₃]           /* by table lookup */
 4. s₅ ← r(α⁵)             /* by matrix multiplication by N₅ */
 5. c ← DLOG[s₅]           /* by table lookup */
 6. if s₁ = 0 then d ← b else if s₃ = 0 then d ← 0
      else d ← Z[b − 3a mod 2ᵉ − 1]
 7. if s₁ = 0 then e ← c else if s₅ = 0 then e ← 0
      else e ← Z[c − 5a mod 2ᵉ −1]
 8. if s₁ ≠ 0 && (b − 3a mod 2ᵉ − 1 = V[e] || Z[b − 3a mod 2ᵉ − 1] =
      V[e]) then correct 1-bit error or 2-bit error;
```

In one embodiment of the decoder for the 3-bit error case, there can be a note for an argument x in the tables for calculating the zeros of the transformed cubic equation W1 [x], W2[x] and W3 [x] using a specific value, which cannot occur as discrete logarithm of the calculation (e.g., $2^e-1$), said note stating that the cubic equation has no solution for this argument. If a table lookup for $q_1$, $q_2$ or $q_3$ in step 13 or 15 supplies this specific value, the decoder has found a non-correctable multiple error. Here, it is sufficient for the result of a table lookup to be checked. In a further variant, the specific argument (e.g., $2^e-1$) is already used when the cubic equation has fewer than three solutions. This is because the case where the cubic equation only has one solution in $GF(2^e)$ likewise leads to a non-correctable multiple error.

In one implementation, which can decode all codewords with up to 3 bit errors, the area required for the implementation of the tables can be reduced if only the tables D LOG[x], Z[x], V[x], W1 [x], W2[x] and W3 [x] are realized in contrast to the above-described procedure for decoding 1-bit, 2-bit and 3-bit errors using the tables D LOG[x], Z[x], Q1 [x], Q2[x], W1 [x], W2[x] and W3 [x]. The values of the tables Q1 [x] and Q2[x] are then calculated where necessary using the tables Z[x] and V[x]. This variant requires more table lookups than the above-described implementation for the purposes of correcting a 2-bit error.

In one implementation, which can decode all codewords with up to 3 bit errors, the area required for the implementation of the tables can be reduced if only the tables D LOG[x], Z[x], V[x] and W1 [x] are realized in contrast to the above-described procedure for decoding 1-bit, 2-bit and 3-bit errors using the tables D LOG[x], Z[x], V[x], W1 [x], W2[x] and W3 [x]. The values of the tables W2[x] and W3 [x] are then calculated where necessary using the tables Z[x], V[x] and W1 [x]. This variant requires more table lookups than the above-described implementation for the purposes of correcting a 3-bit error. Let $\xi_1$, $\xi_2$ and $\xi_3$ be the zeros of the equation $z^3+z=\alpha^x$. Without loss of generality assume that the zero $1i$ is known by a first table lookup using the precalculated table W1 [x]. Then the remaining zeroes $\xi_2$ and $\xi_3$ can be calculated as follows: divide the cubic equation $z^3+z=\alpha^x$ by the linear factor $z+\xi_1=0$ to get the quadratic polynomial $z^2+\xi_1 z=\xi_1^2+1$. Using the substitution $z=y\xi_1$ the equation $y^2+y=1+1/\xi_1^2$ is obtained. Let $\delta_1$ and $\delta_2$ be the zeroes of the quadratic polynomial $y^2+y=1+1/\xi_1^2$. Then $\xi_2=\xi_1 \delta_1$ and $\xi_3=\xi_1 \delta_2$. are the sought after zeroes of the cubic equation. Solving a quadratic polynomial equation can be done by the mechanisms implemented for correcting a 2-bit error.

By taking discrete logarithms we obtain the equations D LOG$[\xi_2]$=x+V[Z[2x mod $2^e$-1]-2x mod $2^e$-1] mod $2^e$-1 and D LOG$[\xi_3]$=x+Z[V[Z[2x mod $2^e$-1]-2x mod $2^e$-1]] mod $2^e$-1 for calculation of the discrete logarithms of the zeroes $\xi_2$ and $\xi_3$. By reusing the tables Z[x] and V[x] which can also be applied for decoding the 2-bit error case it is possible to reduce the number of precalculated tables to the four functions D LOG[x], Z[x], V[x] and W1 [x] for correcting a 3-bit error. By this approach the size of the circuit for decoding encoded messages can be reduced further. The correctness of the algorithm does not depend on the concrete choices of the respective roots of $z^3+z=\alpha^x$ in table W1[x] or the roots of $y^2+y=\alpha^x$ in table V[x]. I.e., entries in W1 [x] can be interchanged with W2[x] and W3[x] and entries in V[x] can be interchanged with Z[V[x]], respectively.

Figure 2:
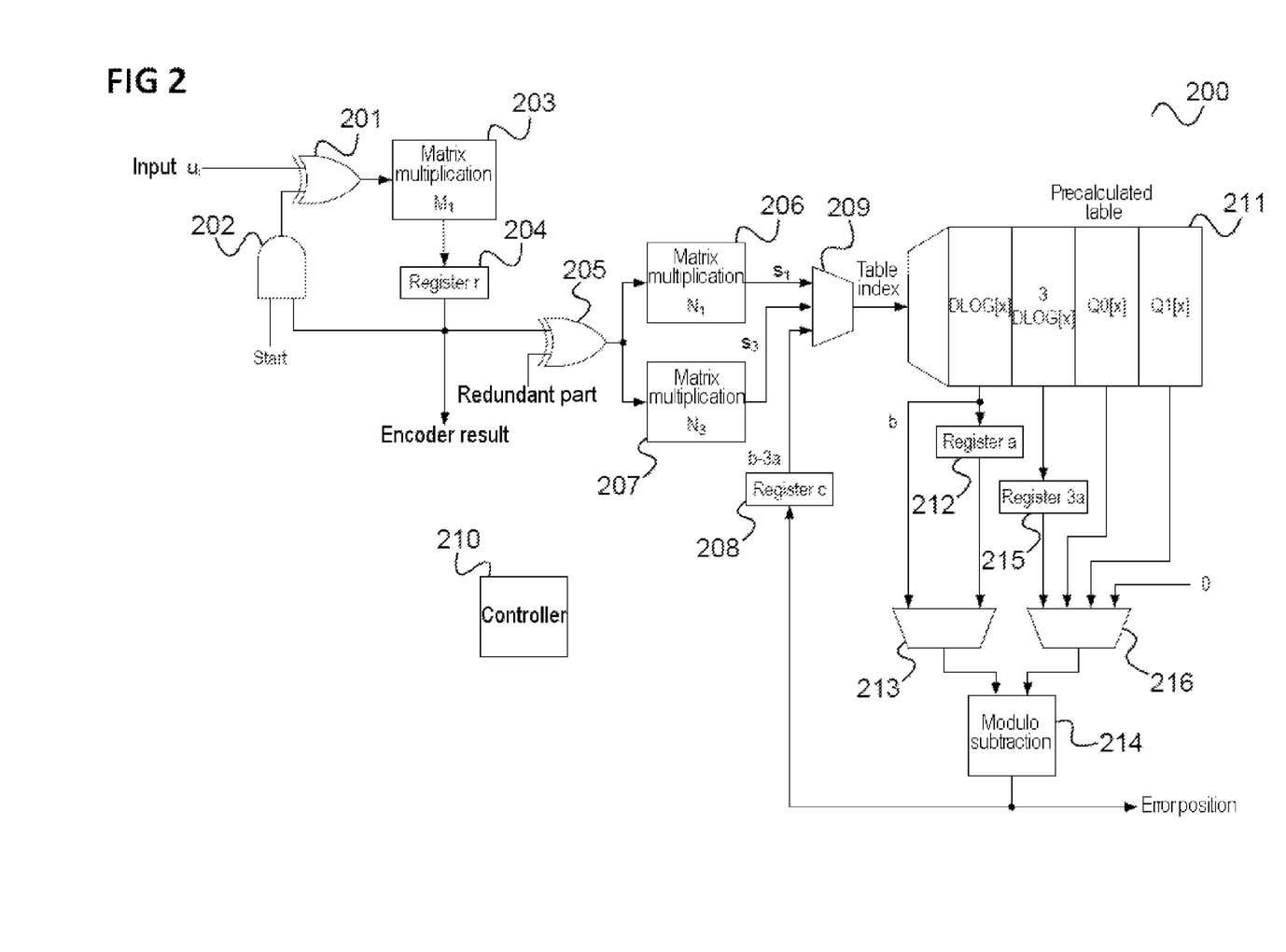
FIG. 2 shows a circuit which implements a BCH encoder and BCH decoder for 1-bit and 2-bit error cases.

FIG. 2 shows a circuit 200 which implements a BCH encoder and BCH decoder for 1-bit and 2-bit error cases.

By way of example, the circuit 200 can be used as a circuit 103 in the security IC 100. In the shown implementation variant, the message is processed in blocks with a fixed width and the value 3d log(x) is established by table lookup in a precalculated table.

The circuit 200 has a first XOR gate 201, the one input of which receives the input bits $u_i$. The second input of the XOR gate 201 is connected to the output of an AND gate 202. The output of the first XOR gate 201 is output to a first multiplier 203, which carries out a multiplication by the matrix $M_1$. The result of the multiplication is stored in a register r 204. For encoding purposes, the bits stored in the register r 204 form the bits of the codeword produced.

The AND gate 202 receives a start bit and the bits stored in the register r 204. For decoding, the bits stored in the register r are supplied to a second XOR gate 205, which at its second input receives the redundant part of the received message to be decoded. The bits output by the second XOR gate 205 are output to a second multiplier 206, which carries out multiplication by the matrix $N_1$, and to a third multiplier 207, which carries out multiplication by the matrix $N_3$.

Together with the content of a register c 208, the outputs of the second multiplier 206 and of the third multiplier 207 are supplied to a multiplexer (or selection circuit) 209, which, under control of a control device 210, calculates the index on a table 211 such that the correct entry of the table, as currently evaluated according to the decoding algorithm, is output. The table 211 stores D LOG[x], 3D LOG[x], Q0[x] and Q1[x] for various arguments.

The result of D LOG[x] is stored in a register a 212 (if s1 was used for indexing the table 211) or output as value b (if s3 was used to index the table 211). By way of a first multiplexer 213, which is controlled by the control device 210, one of the values is supplied to a subtractor 214.

The result of 3D LOG[x] is stored in a register 3a 215. A second multiplexer 216, which is controlled by the control device 210, outputs the value stored in the register 215, the result of Q0[x], the result of Q1 [x] or the value 0, to the subtractor 214.

The subtractor 214 carries out a subtraction of its inputs modulo $2^e$-1. The output of the subtractor 214 either is stored in the register c or specifies an error position in the received message, depending on where in the algorithm the processing is carried out.

Figure 3:
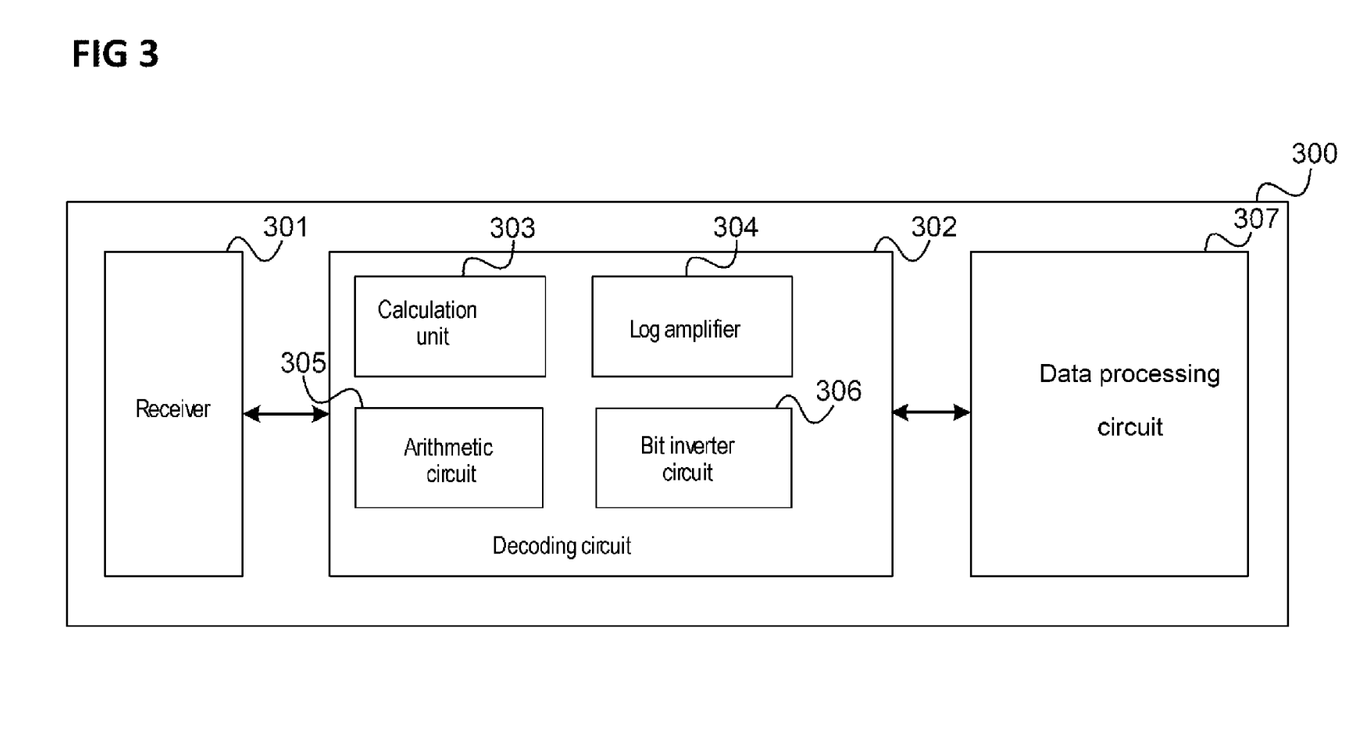
FIG. 3 shows an integrated circuit.

In summary, an integrated circuit, as illustrated in FIG. 3, is provided according to various embodiments.

FIG. 3 shows an integrated circuit 300.

The integrated circuit 300 has a receiver 301, which is configured to receive a message word.

Moreover, the integrated circuit 300 has an integrated hardware decoding circuit 302 with a calculation unit (e.g., a multiplier) 303, which is configured to calculate a syndrome of the message word according to a predetermined BCH code, wherein the syndrome has one or more syndrome components in an extension field of a prime field, a logarithmization unit 304 which is configured to establish a logarithm of each of the one or more syndrome components, an arithmetic circuit 305 which is configured to establish a logarithm of each of one or more zeros of the error locator polynomial of the BCH code on the basis of the logarithms of the one or more syndrome components and a bit inverter circuit 306 which is configured to invert the bits of the message word, the positions of which are specified by the logarithms of the one or more zeros of the error locator polynomial.

Further, the integrated circuit 300 has a data processing circuit 307 which is configured to process further the message word processed by the bit inverter circuit.

Thus, a logarithm is already taken early in the decoding according to various embodiments. This is because the logarithm of the syndrome components is taken. Hence, calculations can be carried out with the logarithms in the subsequent calculation, as a result of which it is possible to avoid arithmetic of the extension field being implemented. Implementing the arithmetic of the extension field would typically be carried out by way of a programmable microprocessor since a dedicated hardware circuit (i.e., a hardwired circuit) requires too much area. According to the procedure described with reference to FIG. 3, it is possible to provide a dedicated hardware circuit instead of a programmable microprocessor as a result of avoiding an implementation of the field arithmetic, said hardware circuit carrying out the decoding. Thus, for example, the calculation unit, the logarithmization unit, the arithmetic circuit and the bit inverter circuit are configured as hardware circuits, i.e., as an unchangeably configured arrangement of hardware circuits (gates, multiplexers, etc.).

Establishing the corrupt positions of the message word (i.e., the corrupt bit positions) is implemented on the basis of the error locator polynomial that belongs to the BCH code. The corrupt positions are provided by the logarithms of the zeros of the error locator polynomial. Here, this can also be based on a mirrored version of the error locator polynomial, in which the sequence of the coefficients is interchanged (the leading coefficient of the error locator polynomial becomes the constant coefficient upon mirroring; the coefficient following the leading coefficient becomes the linear coefficient, etc.): The zeros of the mirrored error locator polynomial are the inverses of the zeros of the error locator polynomial and consequently the logarithms of the zeros of the mirrored error locator polynomial differ from the logarithms of the zeros of the error locator polynomial merely in terms of the sign.

The integrated circuit described with reference to FIG. 3 can be used in conjunction with a memory, in particular a non-volatile memory, as described above. However, it can also be used, for example, for communication via a (wireless or wired) communications channel in order to render it possible to correct transmission errors. In this case, the circuit 103 is provided in a transmission/reception device, for example.

According to various embodiments, one or more of the following are provided in order to facilitate a hardware implementation of a BCH decoder:

Explicit calculation and tabulation of the zeros of the (rationally transformed) error locator polynomial: Because the polynomial after the transformation in each case only depends on one value calculated from the syndrome components, the size of the required tables only grows with O(n log(n)). At the same time, many additionally required operations of field elements can be included in the precalculated tables.

Taking the logarithms of the equations for the zeros of the error locator polynomial: As a result of an early calculation of the logarithms $a=d \log(s_1)$, $b=d \log(s_3)$ and $c=d \log(s_5)$ from the syndrome components $s_1$, $s_2$ and $s_3$ (to the extent that the components are present in the employed code), the multiplications and divisions in the final extension field, which are to be implemented with comparatively large outlay in the vector space representation, can be converted into simpler modular additions and subtractions in the discrete logarithm representation.

Use of the mirrored error locator polynomial: By mirroring the error locator polynomial, it is possible to significantly simplify the necessary rational functions for transforming the "mirrored" cubic error locator polynomial, which depends on the syndrome component values, in the 3-bit error case. The transformation is a rational transformation, i.e., substitution with the rational term.

Figure 4:
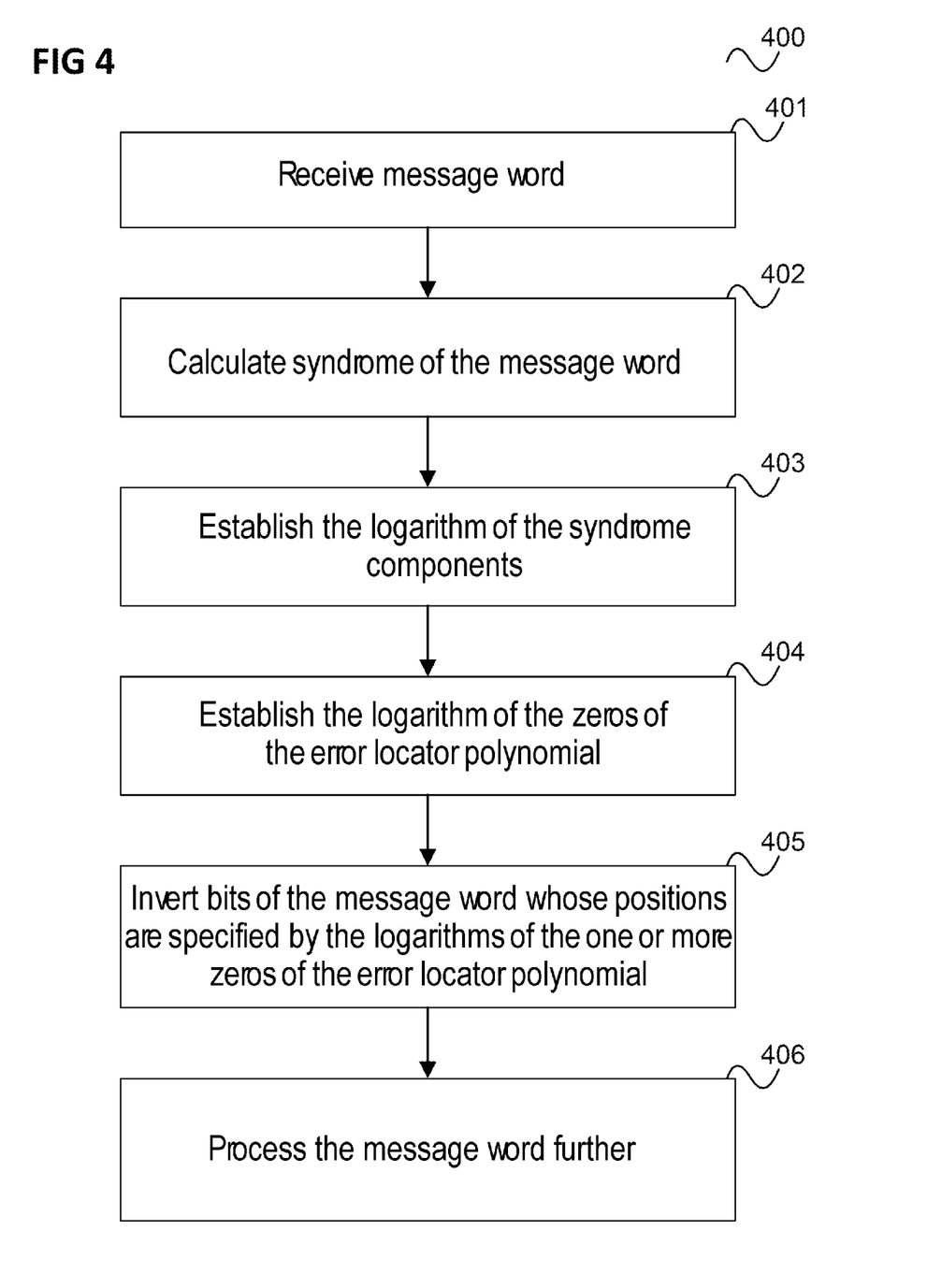
FIG. 4 shows a flowchart elucidating a method for processing an encoded message word.

FIG. 4 shows a flowchart 400, which elucidates a method for processing an encoded message word.

In 401, a message word is received.

In 402, a syndrome of the message word is calculated according to a predetermined BCH code, wherein the syndrome has one or more syndrome components in an extension field of a prime field.

In 403, a logarithm of each of the one or more syndrome components is established.

In 404, a logarithm of each of one or more zeros of the error locator polynomial of the BCH code is established on the basis of the logarithms of the one or more syndrome components.

In 405, the bits of the message word whose positions are specified by the logarithms of the one or more zeros of the error locator polynomial are inverted.

In 406, the message word (corrected according to 405) is processed further.

Embodiments are specified below.

Embodiment 1 is an integrated circuit, as illustrated in FIG. 3.

Embodiment 2 is an integrated circuit as per embodiment 1, wherein the receiver has a memory interface and is configured to read the message word from a memory.

Embodiment 3 is an integrated circuit as per embodiment 2, wherein the data processing circuit is configured to store the message word, processed by the bit inverter circuit, in the memory again.

Embodiment 4 is an integrated circuit as per embodiment 2 or 3, wherein the memory is a non-volatile memory.

Embodiment 5 is an integrated circuit as per any one of embodiments 1 to 4, wherein the logarithms of the one or more syndrome components are logarithms of the syndrome components in respect of a primitive element of the extension field.

Embodiment 6 is an integrated circuit as per embodiment 5, wherein the logarithmization unit is configured to establish the logarithms by way of a lookup in a precalculated logarithm table.

Embodiment 7 is an integrated circuit as per embodiment 6, wherein the precalculated table has a size of O(n log n), where n is the length of the BCH code.

Embodiment 8 is an integrated circuit as per any one of embodiments 1 to 7, wherein the arithmetic circuit is configured to avoid arithmetic of the extension field such that an efficient hardware implementation is facilitated.

Embodiment 9 is an integrated circuit as per any one of embodiments 1 to 8, wherein the hardware decoding circuit is configured to operate without a programmable processor.

Embodiment 10 is an integrated circuit as per any one of embodiments 1 to 9, wherein the hardware decoding circuit is hardwired.

Embodiment 11 is an integrated circuit as per any one of embodiments 1 to 10, wherein the prime field is GF(2).

Embodiment 12 is an integrated circuit as per any one of embodiments 1 to 11, wherein the arithmetic circuit is configured to establish the logarithms of the zeros of the error locator polynomial on the basis of a mirrored version of the error locator polynomial.

Embodiment 13 is an integrated circuit as per any one of embodiments 1 to 12, wherein the arithmetic circuit is configured to establish the logarithms of the zeros of the error locator polynomial on the basis of a version of the mirrored version of the error locator polynomial that is transformed according to a rational transformation, the coefficients of which are independent of the syndrome components apart from the constant coefficient.

Embodiment 14 is an integrated circuit as per any one of embodiments 1 to 13, wherein the arithmetic circuit is configured to establish the logarithms of the zeros of the error locator polynomial by way of a lookup in a precalculated zeros table, which contains information items about the logarithms of the zeros of the error locator polynomial as a function of the constant coefficient of the transformed mirrored version of the error locator polynomial. According to one embodiment, the arithmetic circuit is configured to establish the logarithm of at least one zero of the error locator polynomial by way of a lookup in the precalculated zeros table and to calculate the logarithms of the other zeros of the error locator polynomial based on the knowledge about the logarithm of the at least one zero established by lookup in the precalculated zeros table.

Embodiment 15 is a method for processing an encoded message word, as illustrated in FIG. 4.

Embodiment 16 is a method as per embodiment 15, including reading the message word from a memory.

Embodiment 17 is a method as per embodiment 16, including storing the message word, processed by inverting the bits, in the memory again.

Embodiment 18 is a method as per embodiment 16 or 17, wherein the memory is a non-volatile memory.

Embodiment 19 is a method as per any one of embodiments 15 to 18, wherein the logarithms of the one or more syndrome components are logarithms of the syndrome components in respect of a primitive element of the extension field.

Embodiment 20 is a method as per embodiment 19, including establishing the logarithms by way of a lookup in a precalculated logarithm table.

Embodiment 21 is a method as per embodiment 20, wherein the precalculated table has a size of O(n log n), where n is the length of the BCH code.

Embodiment 22 is a method as per any one of embodiments 15 to 21, further including avoiding arithmetic of the extension field such that an efficient hardware implementation is facilitated.

Embodiment 23 is a method as per any one of embodiments 15 to 22, further including carrying out the calculation of the syndrome, establishing the logarithm of each of the one or more syndrome components, establishing the logarithm of each of one or more zeros of the error locator polynomial of the BCH code and inverting the bits of the message word without a programmable processor.

Embodiment 24 is a method as per any one of embodiments 15 to 23, further including carrying out the calculation of the syndrome, establishing the logarithm of each of the one or more syndrome components, establishing the logarithm of each of one or more zeros of the error locator polynomial of the BCH code and inverting the bits of the message word by means of a hardwired hardware decoding circuit.

Embodiment 25 is a method as per any one of embodiments 15 to 24, wherein the prime field is GF(2).

Embodiment 26 is a method as per any one of embodiments 15 to 25, further including establishing the logarithms of the zeros of the error locator polynomial on the basis of a mirrored version of the error locator polynomial.

Embodiment 27 is a method as per any one of embodiments 15 to 26, further including establishing the logarithms of the zeros of the error locator polynomial on the basis of a version of the mirrored version of the error locator polynomial that is transformed according to a rational transformation, the coefficients of which are independent of the syndrome components apart from the constant coefficient.

Embodiment 28 is a method as per any one of embodiments 15 to 27, further including establishing the logarithms of the zeros of the error locator polynomial by way of a lookup in a precalculated zeros table, which contains information items about the logarithms of the zeros of the error locator polynomial as a function of the constant coefficient of the transformed mirrored version of the error locator polynomial. According to one embodiment, the method comprises establishing the logarithm of at least one zero of the error locator polynomial by way of a lookup in the precalculated zeros table and calculating the logarithms of the other zeros of the error locator polynomial based on the knowledge about the logarithm of the at least one zero established by lookup in the precalculated zeros table.

Embodiment 29 is an apparatus for processing an encoded message word, including means for receiving a message word, means for calculating a syndrome of the message word according to a predetermined BCH code, wherein the syndrome has at least one or more syndrome components in an extension field of a prime field, means for establishing a logarithm of each of one or more syndrome components, means for establishing a logarithm of each of one or more zeros of the error locator polynomial of the BCH code on the basis of the logarithms of the one or more syndrome components, means for inverting the bits of the message word, the positions of which are specified by the logarithms of the one or more zeros of the error locator polynomial, and means for processing the message word further.

Embodiment 30 is an apparatus as per embodiment 29, further including means for reading the message word from a memory.

Embodiment 31 is an apparatus as per embodiment 30, further including means for storing the message word, processed by inverting the bits, in the memory again.

Embodiment 32 is an apparatus as per embodiment 30 or 31, wherein the memory is a non-volatile memory.

Embodiment 33 is an apparatus as per any one of embodiments 29 to 32, wherein the logarithms of the one or more syndrome components are logarithms of the syndrome components in respect of a primitive element of the extension field.

Embodiment 34 is an apparatus as per embodiment 33, wherein the means for establishing the logarithms establish the logarithms by way of a lookup in a precalculated logarithm table.

Embodiment 35 is an apparatus as per embodiment 34, wherein the precalculated table has a size of O(n log n), where n is the length of the BCH code.

Embodiment 36 is an apparatus as per any one of embodiments 29 to 35, wherein the means for receiving the message word, the means for calculating the syndrome of the message word, the means for establishing the logarithm of each of the one or more syndrome components, the means for establishing the logarithm of each of one or more zeros of the error locator polynomial, the means for inverting the bits of the message word and the means for further processing avoid arithmetic of the extension field such that an efficient hardware implementation is facilitated.

Embodiment 37 is an apparatus as per any one of embodiments 29 to 36, wherein the means for receiving the message word, the means for calculating the syndrome of the message word, the means for establishing the logarithm of each of the one or more syndrome components, the means for establishing the logarithm of each of one or more zeros of the error locator polynomial, the means for inverting the bits of the message word and the means for further processing operate without a programmable processor.

Embodiment 38 is an apparatus as per any one of embodiments 29 to 37, wherein the means for receiving the message word, the means for calculating the syndrome of the message word, the means for establishing the logarithm of each of the one or more syndrome components, the means for establishing the logarithm of each of one or more zeros of the error locator polynomial, the means for inverting the bits of the message word and the means for further processing operate by means of a hardwired hardware decoding circuit.

Embodiment 39 is an apparatus as per any one of embodiments 29 to 38, wherein the prime field is GF(2).

Embodiment 40 is an apparatus as per any one of embodiments 29 to 39, wherein the means for establishing the logarithms of the zeros of the error locator polynomial operate on the basis of a mirrored version of the error locator polynomial.

Embodiment 41 is an apparatus as per any one of embodiments 29 to 40, wherein the means for establishing the logarithms of the zeros of the error locator polynomial operate on the basis of a version of the mirrored version of the error locator polynomial that is transformed according to a rational transformation, the coefficients of which are independent of the syndrome components apart from the constant coefficient.

Embodiment 42 is an apparatus as per any one of embodiments 29 to 41, wherein the means for establishing the logarithms of the zeros of the error locator polynomial establish the logarithms of the zeros of the error locator polynomial by way of a lookup in a precalculated zeros table, which contains information items about the logarithms of the zeros of the error locator polynomial as a function of the constant coefficient of the transformed mirrored version of the error locator polynomial. According to one embodiment, the means for establishing the logarithms of the zeros of the error locator polynomial establish the logarithm of at least one zero of the error locator polynomial by way of a lookup in the precalculated zeros table and calculate the logarithms of the other zeros of the error locator polynomial based on the knowledge about the logarithm of the at least one zero established by lookup in the precalculated zeros table.

According to one embodiment, an integrated circuit is provided, said integrated circuit including a receiver configured to receive a message word and an integrated hardware decoding circuit. The hardware decoding circuit includes a calculation unit configured to calculate a syndrome of the message word according to a predetermined BCH code, wherein the syndrome has one or more syndrome components in an extension field of a prime field, a logarithmization unit configured to establish a logarithm of each of the one or more syndrome components, an arithmetic circuit configured to establish a logarithm of each of one or more zeros of the error locator polynomial of the BCH code on the basis of the logarithms of the one or more syndrome components and a bit inverter circuit configured to invert the one or more bits of the message word, the positions of which are specified by the logarithms of the one or more zeros of the error locator polynomial. The integrated circuit further includes a data processing circuit configured to process further the message word processed by the bit inverter circuit.

According to a further embodiment, a method for processing an encoded message word according to the above-described integrated circuit is provided.

LIST OF REFERENCE SIGNS

100 Security circuit
101 Non-volatile memory
102 Microprocessor
103 Hardware circuit
104 Encoder
105 Decoder
200 Encoder-decoder circuit
201 XOR gate
202 AND gate
203 Multiplier
204 Register
205 XOR gate
206 Multiplier
207 Multiplier
208 Register
209 Multiplexer
210 Control device
211 Table
212 Register
213 Multiplexer
214 Subtractor
215 Register
216 Multiplexer
300 Integrated circuit
301 Receiver
302 Decoding circuit
303 Calculation unit
304 Logarithmization unit
305 Arithmetic circuit
306 Bit inverter circuit
307 Data processing circuit
400 Flowchart
401-406 Method steps While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
    a receiver configured to receive a message word;
    an integrated hardware decoding circuit, comprising
        a calculation unit configured to calculate a syndrome of the message word according to a predetermined Bose-Chaudhuri-Hocquenghem (BCH) code, wherein the syndrome has one or more syndrome components in an extension field of a prime field;
        a logarithmization unit configured to establish a logarithm of each of the one or more syndrome components;
        an arithmetic circuit configured to establish a logarithm of each of one or more zeros of an error locator polynomial of the BCH code on the basis of the logarithms of the one or more syndrome components;
        a bit inverter circuit configured to invert the one or more bits of the message word, the positions of which are specified by the logarithms of the one or more zeros of the error locator polynomial;
        a data processing circuit configured to store the message word processed by the bit inverter circuit;
    wherein the arithmetic circuit is further configured to establish the logarithm of each of the one or more zeros of the error locator polynomial on the basis of a mirrored version of the error locator polynomial.

2. The integrated circuit as claimed in claim 1, wherein the receiver has a memory interface and is configured to read the message word from a memory.

3. The integrated circuit as claimed in claim 2, wherein the data processing circuit is configured to store the message word, processed by the bit inverter circuit, in the memory.

4. The integrated circuit as claimed in claim 2, wherein the memory is a non-volatile memory.

5. The integrated circuit as claimed in claim 1, wherein the logarithms of the one or more syndrome components are logarithms of the syndrome components in respect of a primitive element of the extension field.

6. The integrated circuit as claimed in claim 5, wherein the logarithmization unit is configured to establish the logarithms by way of a lookup in a precalculated logarithm table.

7. The integrated circuit as claimed in claim 6, wherein the precalculated table has a size of O(n log n), where n is the length of the BCH code.

8. The integrated circuit as claimed in claim 1, wherein the arithmetic circuit is configured to avoid arithmetic of the extension field such that an efficient hardware implementation is utilized.

9. The integrated circuit as claimed in claim 1, wherein the hardware decoding circuit is configured to operate without a programmable processor.

10. The integrated circuit as claimed in claim 1, wherein the hardware decoding circuit is hardwired.

11. The integrated circuit as claimed in claim 1, wherein the prime field is GF(2).

12. The integrated circuit as claimed in claim 1, wherein the arithmetic circuit is configured to establish the logarithm of each of the one or more zeros of the error locator polynomial on the basis of a version of the mirrored version of the error locator polynomial that is transformed according to a rational transformation, the coefficients of which are independent of the one or more syndrome components apart from the constant coefficient.

13. The integrated circuit as claimed in claim 12, wherein the arithmetic circuit is configured to establish the logarithm of each the one or more zeros of the error locator polynomial by way of a lookup in a precalculated zeros table, which contains information items about the logarithms of the zeros of the error locator polynomial as a function of the constant coefficient of the mirrored version of the error locator polynomial that has been transformed.

14. The integrated circuit as claimed in claim 13, wherein the arithmetic circuit is configured to establish the logarithm of at least one zero of the error locator polynomial by way of a lookup in the precalculated zeros table and to calculate the logarithm of each of the one or more zeros of the error locator polynomial other than the at least one zero of the error locator polynomial whose logarithm was established by way of the loop in the precalculated zeros table, based on knowledge about the logarithm of the at least one zero established by lookup in the precalculated zeros table.

15. A method for processing an encoded message word, including:
    receiving a message word;
    calculating a syndrome of the message word according to a predetermined Bose-Chaudhuri-Hocquenghem (BCH) code, wherein the syndrome has at least one or more syndrome components in an extension field of a prime field;
    establishing a logarithm of each of the one or more syndrome components;
    establishing a logarithm of each of one or more zeros of an error locator polynomial of the BCH code on the basis of the logarithms of the one or more syndrome components;
    inverting the bits of the message word, the positions of which are specified by the logarithms of the one or more zeros of the error locator polynomial;
    processing the message word further
    wherein the logarithm of each of the one or more zeros of the error locator polynomial is established on the basis of a mirrored version of the error locator polynomial.

16. The method as claimed in claim 15, wherein the logarithms of the one or more syndrome components are logarithms of the syndrome components in respect of a primitive element of the extension field.

17. The method as claimed in claim 15, wherein the logarithms are established by way of a lookup in a precalculated logarithm table.

18. The method as claimed in claim 17, wherein the precalculated table has a size of O(n log n), where n is the length of the BCH code.

19. The method as claimed in claim 15, wherein the prime field is GF(2).

20. The method as claimed in claim 15, wherein the logarithm of each of the one or more zeros of the error locator polynomial are established on the basis of a mirrored version of the error locator polynomial.

21. The integrated circuit of claim 1, wherein calculating a syndrome of the message word according to the predetermined (BCH) code comprises determining a generator polynomial of the predetermined (BCH) code by selecting minimal polynomials of powers of a primitive element of the extension field and determining a least common multiple of the determined minimal polynomials, wherein the minimal polynomials are selected such that a weight of a matrix for calculating a remainder of a polynomial division of a polynomial associated with the message word by the generator polynomial is minimal.

* * * * *